US011195465B2

(12) United States Patent
Lee et al.

(10) Patent No.: US 11,195,465 B2
(45) Date of Patent: Dec. 7, 2021

(54) DISPLAY DEVICE

(71) Applicant: Samsung Display Co., Ltd., Yongin-Si (KR)

(72) Inventors: Hyojin Lee, Yongin-si (KR); Sehyuk Park, Seongnam-si (KR); Jinyoung Roh, Hwaseong-si (KR); Geunjeong Park, Hwaseong-si (KR); Eunho Lee, Suwon-si (KR); Hui Nam, Suwon-si (KR); Bonghyun You, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/737,363

(22) Filed: Jan. 8, 2020

(65) Prior Publication Data

US 2020/0219450 A1 Jul. 9, 2020

(30) Foreign Application Priority Data

Jan. 9, 2019 (KR) ........................ 10-2019-0002847

(51) Int. Cl.
*G09G 3/3258* (2016.01)
*G09G 3/3266* (2016.01)
*G09G 3/3275* (2016.01)
*H01L 27/12* (2006.01)

(52) U.S. Cl.
CPC ......... *G09G 3/3258* (2013.01); *G09G 3/3266* (2013.01); *G09G 3/3275* (2013.01); *G09G 2320/0673* (2013.01); *H01L 27/1225* (2013.01)

(58) Field of Classification Search
CPC .. G09G 3/3258; G09G 3/3266; G09G 3/3275; G09G 2320/0673; H01L 27/1225
See application file for complete search history.

(56) References Cited

U.S. PATENT DOCUMENTS

| 9,721,525 | B2 | 8/2017 | Park et al. |
| 10,129,522 | B2 | 11/2018 | Gouache et al. |
| 10,157,574 | B2 | 12/2018 | Park et al. |
| 2008/0106316 | A1* | 5/2008 | Ha .................. H03K 5/2481 327/299 |

(Continued)

FOREIGN PATENT DOCUMENTS

| KR | 10-2014-0097236 | 8/2014 |
| KR | 10-2014-0148448 | 12/2014 |

(Continued)

*Primary Examiner* — Kenneth B Lee, Jr.
(74) *Attorney, Agent, or Firm* — F. Chau & Associates, LLC

(57) ABSTRACT

A display device including: a display panel including a pixel connected to a first scan line, second scan line, and data line, the pixel including: a first switch connected to the first scan line; a second switch connected to the second scan line; and a light emitting element; a low-frequency driving controller to output a power control signal having a first level in a first mode and a second power control signal having a second level in a second mode; a scan driver including first and second scan drivers to drive the first and second scan lines, wherein one of the first and second scan drivers operates in the second mode; and a data driver to operate in the second mode in response to the power control signal having the second level, wherein the data driver operates at a frequency lower than a reference frequency in the second mode.

30 Claims, 20 Drawing Sheets

(56) References Cited

U.S. PATENT DOCUMENTS

| | | | |
|---|---|---|---|
| 2013/0258167 A1 | 10/2013 | Gum | |
| 2016/0063962 A1* | 3/2016 | Park | G09G 3/3685 345/211 |
| 2016/0098959 A1 | 4/2016 | Moon et al. | |
| 2017/0061875 A1 | 3/2017 | Cho et al. | |
| 2018/0293939 A1 | 10/2018 | Kim et al. | |
| 2018/0374443 A1* | 12/2018 | Kuei | G09G 3/3611 |

FOREIGN PATENT DOCUMENTS

| | | |
|---|---|---|
| KR | 10-2016-0005839 | 1/2016 |
| KR | 10-2016-0017250 | 2/2016 |
| KR | 10-2016-0027558 | 3/2016 |
| KR | 10-2017-0026762 | 3/2017 |
| KR | 10-2017-0060662 | 6/2017 |

* cited by examiner

DISPLAY DEVICE

CROSS-REFERENCE TO RELATED APPLICATION

This U.S. non-provisional patent application claims priority under 35 U.S.C. § 119 to Korean Patent Application No. 10-2019-0002847, filed on Jan. 9, 2019, the disclosure of which is incorporated by reference herein in its entirety.

TECHNICAL FIELD

The present inventive concept relates to a display device, and more particularly, to a display device that can be driven at a low frequency.

DISCUSSION OF RELATED ART

An organic light emitting display device may display an image by using an organic light emitting diode which generates light by recombination of electrons and holes. The organic light emitting display device works without a backlight because it emits visible light. Thus, the organic light emitting display device can display deep black levels and can be thinner than a liquid crystal display. In addition, the organic light emitting display device may have a fast response speed and may consume low amounts of power.

The organic light emitting display device may include a plurality of pixels connected to data lines and scan lines. For example, each of the pixels may include an organic light emitting diode and a circuit part for controlling an amount of current flowing through the organic light emitting diode. The circuit part may control an amount of current flowing from a first driving voltage, through the organic light emitting diode and to a second driving voltage. The organic light emitting diode may generate light having a predetermined brightness according to the amount of current flowing therethrough.

Transistors having low-temperature polycrystalline silicon (LTPS) semiconductor layers may be included in the circuit part. However, when the second driving voltage is lowered or an operating frequency is lowered, a leakage current may occur in the LTPS transistor. When the leakage current occurs in transistors forming the circuit part in the pixel, the amount of current flowing through the organic light emitting diode may be changed and deteriorate display quality.

SUMMARY

In an exemplary embodiment of the inventive concept, a display device may include a display panel including a pixel connected to a first scan line, a second scan line, and a data line, the pixel including a first switching element connected to the first scan line, a second switching element connected to the second scan line, and a light emitting element; a low-frequency driving controller configured to output a power control signal having a first level in a first operation mode and having a second level in a second operation mode; a scan driver including first and second scan drivers configured to drive the first and second scan lines, wherein one of the first and second scan drivers is configured to operate in the second operation mode; and a data driver configured to output a data signal to the data line and configured to operate in the second operation mode in response to the power control signal having the second level, wherein the data driver operates at a frequency lower than a reference frequency in the second operation mode.

In an exemplary embodiment of the inventive concept, the first switching element may be a transistor including a low-temperature polycrystalline silicon semiconductor layer, and the second switching element may be a transistor including an oxide semiconductor layer.

In an exemplary embodiment of the inventive concept, the first and second scan drivers may operate at the reference frequency in the first operation mode, and the second scan driver may operate at the frequency lower than the reference frequency in the second operation mode.

In an exemplary embodiment of the inventive concept, the data driver may include an output buffer for outputting the data signal, and the output buffer may operate in the second operation mode in response to the power control signal having the second level.

In an exemplary embodiment of the inventive concept, the data driver may further include an on/off controller for turning-on the output buffer in the first operation mode and for turning-off the output buffer in the second operation mode.

In an exemplary embodiment of the inventive concept, the data driver may further include a switching circuit configured to provide a reference voltage to an output terminal of the output buffer in response to the power control signal having the second level.

In an exemplary embodiment of the inventive concept, the switching circuit may be turned-off in the first operation mode and may be turned-on in the second operation mode to apply the reference voltage to the output terminal of the output buffer.

In an exemplary embodiment of the inventive concept, the display device may further include a voltage generator configured to supply the reference voltage to the switching circuit.

In an exemplary embodiment of the inventive concept, the data driver may further include a bias current controller configured to control a bias current of the output buffer.

In an exemplary embodiment of the inventive concept, the bias current controller may adjust the bias current of the output buffer to a preset magnitude in the first operation mode, and the bias current controller may adjust the bias current of the output buffer to a magnitude less than the preset magnitude in the second operation mode.

In an exemplary embodiment of the inventive concept, the pixel may include a first transistor including a first electrode connected to a first driving voltage, a second electrode electrically connected to an anode of the light emitting element, and a gate electrode; a second transistor including a first electrode connected to the data line, a second electrode connected to the first electrode of the first transistor, and a gate electrode connected to the first scan line to receive a first scan signal; and a third transistor including a first electrode connected to the second electrode of the first transistor, a second electrode connected to the gate electrode of the first transistor, and a gate electrode connected to the second scan line to receive a second scan signal.

In an exemplary embodiment of the inventive concept, the second transistor may be included in the first switching element, and the third transistor may be included in the second switching element. The first transistor may be the same type as the second transistor.

In an exemplary embodiment of the inventive concept, the first and second transistors may operate at the reference frequency in the second operation mode, and the third transistor may operate at the frequency lower than the reference frequency in the second operation mode.

In an exemplary embodiment of the inventive concept, the pixel may further include a fourth transistor including a first electrode connected to the gate electrode of the first transistor, a second electrode connected to an initialization voltage line, and a gate electrode configured to receive a third scan signal; a fifth transistor including a first electrode connected to the first driving voltage, a second electrode connected to the first electrode of the first transistor, and a gate electrode configured to receive an emission control signal; a sixth transistor including a first electrode connected to the second electrode of the first transistor, a second electrode connected to the anode of the light emitting element, and a gate electrode configured to receive the emission control signal; and a seventh transistor including a first electrode connected to the second electrode of the fourth transistor, a second electrode connected to the anode of the light emitting element, and a gate electrode configured to receive a fourth scan signal.

In an exemplary embodiment of the inventive concept, the second transistor may be included in the first switching element, and the first, fifth, sixth and seventh transistors may be the same type as the second transistor. The third transistor may be included in the second switching element, and the fourth transistor may be the same type as the third transistor.

In an exemplary embodiment of the inventive concept, each of the first, second, fifth, sixth and seventh transistors may be a transistor including a low-temperature polycrystalline silicon semiconductor layer, and each of the third and fourth transistors may be a transistor including an oxide semiconductor layer.

In an exemplary embodiment of the inventive concept, the first, second, fifth, sixth and seventh transistors may operate at the reference frequency in the second operation mode, and the third and fourth transistors may operate at the frequency lower than the reference frequency in the second operation mode.

In an exemplary embodiment of the inventive concept, a display device may be include a display panel including a pixel connected to a first scan line, a second scan line, and a data line, the pixel including a first type switching element connected to the first scan line, a second type switching element connected to the second scan line, and a light emitting element; a low-frequency driving controller configured to output a first power control signal in a first operation mode and a second power control signal in a second operation mode, wherein in the second operation mode, an image is displayed at a frequency lower than a reference frequency; a scan driver including first and second scan drivers configured to drive the first and second scan lines, respectively, wherein one of the first and second scan drivers is configured to operate in the second operation mode; a data driver configured to provide a data signal to the data line; and a voltage generator configured to control an output or magnitude of at least one voltage, provided to the display panel, the scan driver and the data driver, in response to the first or second power control signal.

In an exemplary embodiment of the inventive concept, the display panel may further include an initialization voltage line configured to receive an initialization voltage, and the voltage generator may be configured to generate the initialization voltage and to supply the initialization voltage to the display panel.

In an exemplary embodiment of the inventive concept, the voltage generator may supply the initialization voltage to the display panel in the first operation mode and may stop the supply of the initialization voltage to the display panel in response to the second power control signal in the second operation mode.

In an exemplary embodiment of the inventive concept, the pixel may include a first transistor including a first electrode connected to a first driving voltage, a second electrode electrically connected to an anode of the light emitting element, and a gate electrode; a second transistor including a first electrode connected to the data line, a second electrode connected to the first electrode of the first transistor, and a gate electrode connected to the first scan line; a third transistor including a first electrode connected to the second electrode of the first transistor, a second electrode connected to the gate electrode of the first transistor, and a gate electrode connected to the second scan line; and a fourth transistor including a first electrode connected to the gate electrode of the first transistor, a second electrode connected to an initialization voltage line, and a gate electrode connected to a third scan line.

In an exemplary embodiment of the inventive concept, each of the first and second transistors may include a low-temperature polycrystalline silicon semiconductor layer, and each of the third and fourth transistors may include an oxide semiconductor layer.

In an exemplary embodiment of the inventive concept, the second transistor may be included in the first switching element and the third transistor may be included in the second switching element. The first transistor may be the same type as the second transistor and the fourth transistor may be, the same type as the third transistor.

In an exemplary embodiment of the inventive concept, the first and second transistors may operate at the reference frequency in the second operation mode, and the third and fourth transistors may operate at the frequency lower than the reference frequency in the second operation mode.

In an exemplary embodiment of the inventive concept, the display device may further include a gamma voltage generator configured to generate a plurality of gamma voltages according to a gamma reference voltage and to provide the generated gamma voltages to the data driver. The voltage generator may be configured to generate the gamma reference voltage and to provide the gamma reference voltage to the gamma voltage generator.

In an exemplary embodiment of the inventive concept, the gamma reference voltage may include a high gamma reference voltage and a low gamma reference voltage. The voltage generator may output a first high voltage and a first low voltage as the high gamma reference voltage and the low gamma reference voltage, respectively, in the first operation mode. The voltage generator may output a second high voltage and a second low voltage as the high gamma reference voltage and the low gamma reference voltage, respectively, in the second operation mode.

In an exemplary embodiment of the inventive concept, when the second high voltage has a lower level than the first high voltage, the second low voltage may have the same level as or a higher level than the first low voltage. When the second low voltage has a higher level than the first low voltage, the second high voltage may have the same level as or a lower level than the first high voltage.

In an exemplary embodiment of the inventive concept, the gamma voltage generator may include a gamma output buffer for outputting the gamma voltages.

In an exemplary embodiment of the inventive concept, the gamma voltage generator may further include an on/off controller for turning-on the gamma output buffer in the first operation mode and for turning-off the gamma output buffer in the second operation mode.

In an exemplary embodiment of the inventive concept, the gamma voltage generator may further include a bias current controller configured to control a bias current of the gamma output buffer. The bias current controller may adjust the bias current of the gamma output buffer to a preset magnitude in the first operation mode, and the bias current controller may adjust the bias current of the gamma output buffer to a magnitude less than the preset magnitude in the second operation mode.

BRIEF DESCRIPTION OF THE DRAWINGS

Exemplary embodiments of the inventive concept will be more clearly understood from the following detailed description taken in conjunction with the accompanying drawings. In the drawings.

DETAILED DESCRIPTION OF THE EMBODIMENTS

Figure 1:
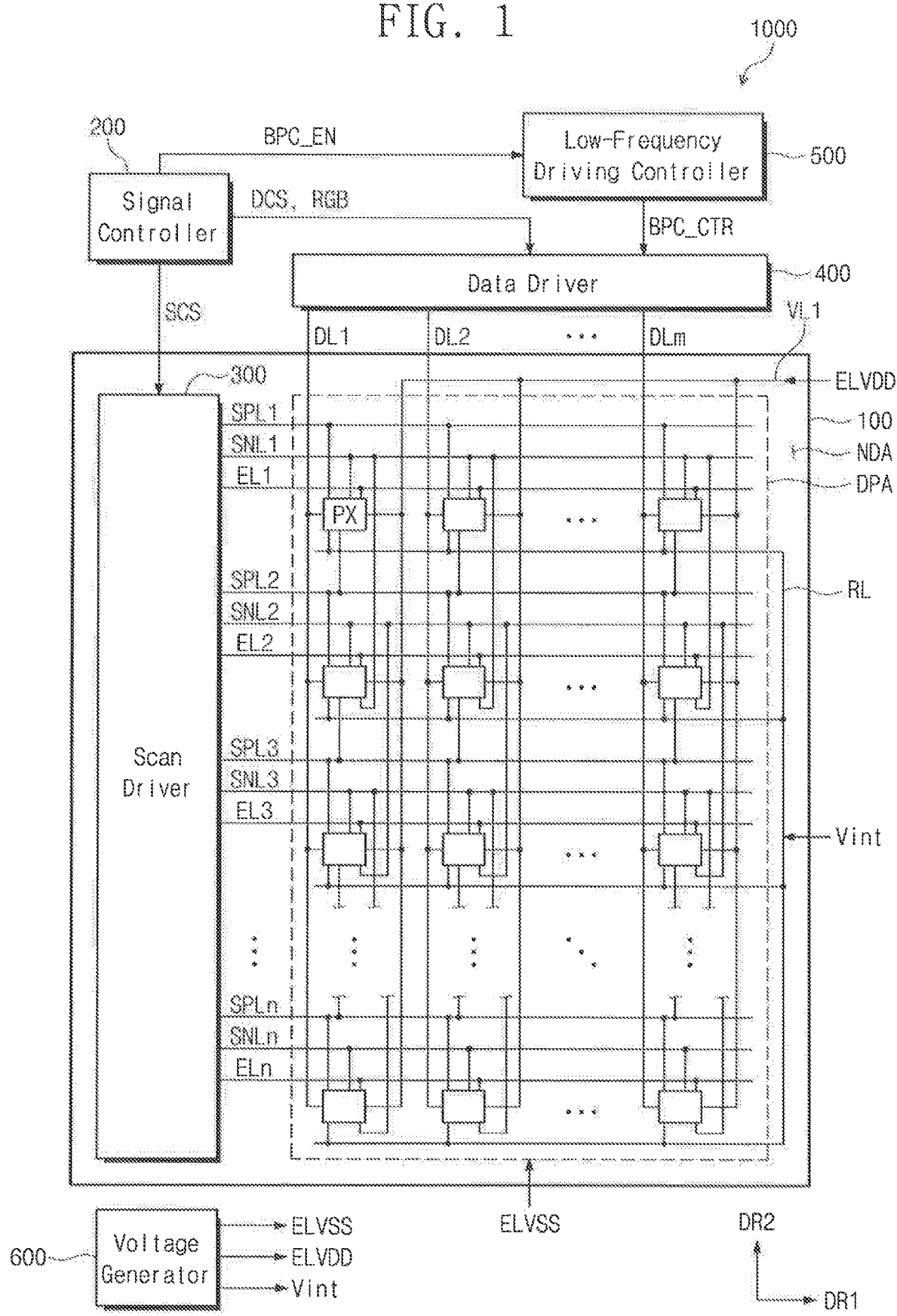
FIG. 1 is a block diagram illustrating a display device according to an exemplary embodiment of the inventive concept.

Exemplary embodiments of the inventive concept will now be described more fully hereinafter with reference to the accompanying drawings. The inventive concept may, however, be embodied in many different forms, and should not be construed as limited to the embodiments set forth herein. Like reference numerals may refer to like elements throughout the specification and drawings.

FIG. 1 is a block diagram illustrating a display device according to an exemplary embodiment of the inventive concept.

Referring to FIG. 1, a display device 1000 may include a display panel 100, a signal controller 200, a scan driver 300, a data driver 400, a low-frequency driving controller 500, and a voltage generator 600.

The signal controller 200 may receive an input image signal and may convert a data format of the input image signal to generate an image data signal RGB matching an interface specification of the data driver 400. The input image signal may be received from an external graphics controller. The signal controller 200 may generate a scan control signal SCS for controlling the scan driver 300 and a data control signal DCS for controlling the data driver 400.

The signal controller 200 may output a power control enable signal BPC_EN for controlling a power mode. The power mode may be a normal operation mode in which an image is displayed at a preset reference frequency (e.g., 60 Hz), or a low-frequency operation mode in which an image is displayed at a low frequency lower than the reference frequency (e.g., less than 60 Hz). For example, when a static image is displayed, the display device 1000 may operate in the low-frequency operation mode.

When the display device 1000 operates in the normal operation mode, the signal controller 200 may output the power control enable signal BPC_EN of a first state. For example, the power control enable signal BPC_EN may have a logic low level in the first state. When the display device 1000 operates in the low-frequency operation mode, the signal controller 200 may output the power control enable signal BPC_EN of a second state. For example, the power control enable signal BPC_EN may have a logic high level in the second state. The lows frequency driving controller 500 may be disabled by the power control enable signal BPC_EN of the first state and may be enabled by the power control enable signal BPC_EN of the second state. In other words, the low-frequency driving controller 500 may be disabled in the normal operation mode and may be enabled in the low-frequency operation mode.

The enabled low-frequency driving controller 500 may output a power control signal BPC_CTR for driving the data driver 400 in the low-frequency operation mode. For example, the power control signal BPC_CTR may have a logic high level in the low-frequency operation mode.

The scan driver 300 may receive the scan control signal SCS from the signal controller 200. The scan control signal SCS may include a start signal for starting an operation of the scan driver 300, and a clock signal. The scan driver 300 may generate a plurality of scan signals and may sequentially output the plurality of scan signals to P-type scan lines SPL1 to SPLn and N-type scan lines SNL1 to SNLn to be described later. In addition, the scan driver 300 may generate a plurality of emission control signals in response to the scan control signal SCS and may output the plurality of emission control signals to a plurality of emission control lines EL1 to ELn to be described later.

According to an exemplary embodiment of the inventive concept, the scan driver 300 may output first scan signals to the P-type scan lines SPL1 to SPLn and may output second scan signals to the N-type scan lines SNL1 to SNLn. The first scan signals may have reversed phases to those of the second scan signals, respectively. In other words, the first scan signals and the second scan signals may have opposite phases with respect to each other.

In FIG. 1, the plurality of scan signals and the plurality of emission control signals are outputted from a single scan driver 300. However, the inventive concept is not limited thereto. For example, a scan driver for generating and outputting the plurality of scan signals may be separated from an emission control driver for generating and outputting the plurality of emission control signals.

In the present embodiment, the scan control signal SCS is provided from the signal controller 200 to the scan driver 300. However, the inventive concept is not limited thereto. For example, the display device 1000 may further include a control block for generating the scan control signal. The control block may receive the power control signal BPC_CTR from the low-frequency driving controller 500 and may output signals for operating the scan driver 300 in the low-frequency operation mode.

The data driver 400 may receive the data control signal DCS and the image data signal RGB from the signal controller 200. The data driver 400 may convert the image data signal RGB into data signals and may output the data signals to a plurality of data lines DL1 to DLM be described later. The data signals may be analog voltages corresponding to gray scale values of the image data signal RGB.

The data driver 400 may operate in the low-frequency operation mode in response to the power control signal BPC_CTR provided from the low-frequency driving controller 500. A structure in which the data driver 400 operates in the low-frequency operation mode will be described later in detail with reference to FIGS. 6 to 11.

The display device 1000 may include the voltage generator 600 for generating voltages used for operations of the display device 1000. In the present embodiment, the voltage generator 600 may generate a first driving voltage ELVDD, a second driving voltage ELVSS, and an initialization voltage Vint. The voltage generator 600 may further generate a voltage for driving the data driver 400 and a gamma reference voltage to be provided to a gamma voltage generator to be described later.

The display panel 100 may include the P-type scan lines SPL1 to SPLn, the N-type scan lines SNL1 to SNLn, the emission control lines EL1 to ELn, the data lines DL1 to DLm, and pixels PX. The P-type scan lines SPL1 to SPLn and the N-type scan lines SNL1 to SNLn may extend in a first direction DR1 and may be spaced apart from each other and arranged in a second direction DR2. For example, a pair of the P-type scan line SPL1 and the N-type scan line SNL1 may be adjacent to each other in the second direction DR2. The data lines DL1 to DLm may extend in the second direction DR2 and may be spaced apart from each other and arranged in the first direction DR1.

Each of the P-type scan lines SPL1 to SPLn may be a scan line connected to a P-type transistor of transistors included in the pixel PX, and each of the N-type scan lines SNL1 to SNLn may be a scan line connected to an N-type transistor of the transistors included in the pixel PX.

The emission control lines EL1 to ELn may be arranged in parallel to the P-type scan lines SPL1 to SPLn and the N-type scan lines SNL1 to SNLn. For example, the emission control line EL1 may be adjacent to the N-type scan line SNL1 in the second direction DR2.

Each of the pixels PX may be connected to a corresponding one of the P-type scan lines SPL1 to SPLn, a corresponding one of the N-type scan lines SNL1 to SNLn, a corresponding one of the emission control lines EL1 to ELn, and a corresponding one of the data lines DL1 to DLm.

In an exemplary embodiment of the inventive concept, each of the pixels PX may be electrically connected to four scan lines. The four scan lines may include at least one N-type scan line and at least one P-type scan line. As illustrated in FIG. 1 the pixels PX of a second pixel row may be connected to second and third P-type scan lines SPL2 and SPL3 and first and second N-type scan lines SNL1 and SNL2.

Each of the pixels PX may include a light emitting element and a circuit part for controlling light emission of the light emitting element. The circuit part may include a plurality of transistors and a capacitor. At least one of the scan driver 300 or the data driver 400 may include transistors formed by the same processes as the circuit part.

The P-type scan lines SPL1 to SPLn, the N-type scan lines SNL1 to SNLn, the emission control lines EL1 to ELn, the data lines DL1 to DLm, the pixels PX, the scan driver 300 and the data driver 400 may be formed on a base substrate through a plurality of thin film processes. Insulating layers may be formed on the base substrate through a plurality of deposition and/or coating processes. Each of the insulating layers may fully cover the display panel 100 or may include at least one insulating pattern overlapping a specific component of the display panel 100. Each of the insulating layers may include an organic layer and/or an inorganic layer. In addition, an encapsulation layer protecting the pixels PX may be additionally formed on the base substrate.

The display panel 100 may receive the first driving voltage ELVDD and the second driving voltage ELVSS. The first driving voltage ELVDD may be provided to the pixels PX through a first driving voltage line VL1. The second driving voltage ELVSS may be provided to the pixels PX through electrodes or a power source line formed in the display panel 100.

The display panel 100 may receive the initialization voltage Vint. The initialization voltage Vint may be provided to the pixels PX through an initialization voltage line RL.

The display panel 100 may include a display area DPA and a non-display area NDA. The pixels PX may be arranged in the display area DPA. In the present embodiment, the scan driver 300 may be disposed in the non-display area NDA at a side of the display area DPA.

The data driver 400 may be in a chip form and mounted in the non-display area NDA of the display panel 100 or mounted on a flexible circuit film connected to the display panel 100.

In exemplary embodiments of the inventive concept, the display device 1000 may include an integrated chip in which at least two or more of the signal controller 200, the low-frequency driving controller 500, the data driver 400, the voltage generator 600, or a scan control signal generator to be described later are provided in a single chip. The integrated chip may be mounted in the non-display area NDA of the display panel 100 or may be mounted on a flexible circuit film connected to the display panel 100. The integrated chip will be described later in detail with reference to FIGS. 12 and 13.

Figure 2:
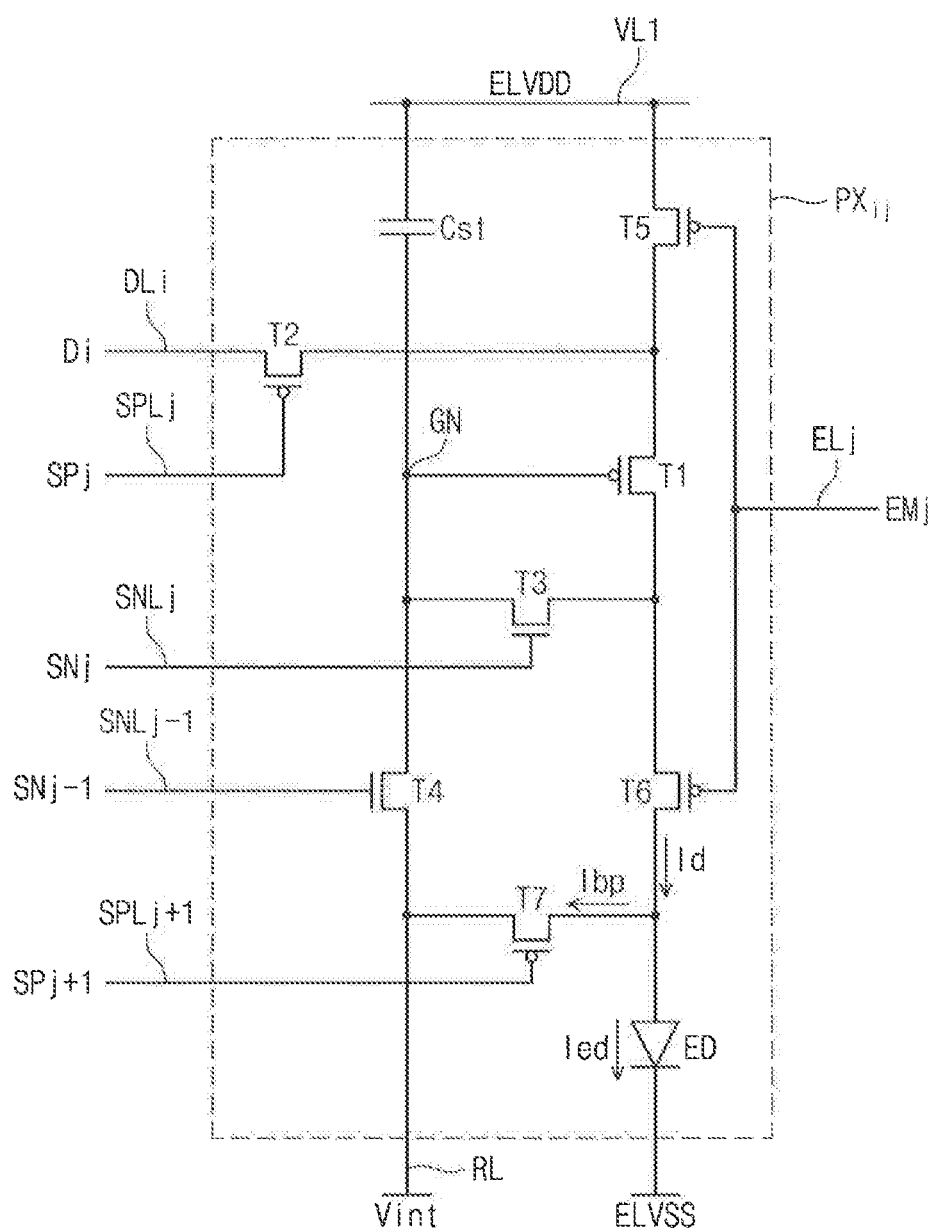
FIG. 2 is an equivalent circuit diagram of a pixel according to an exemplary embodiment of the inventive concept.
Figure 3:
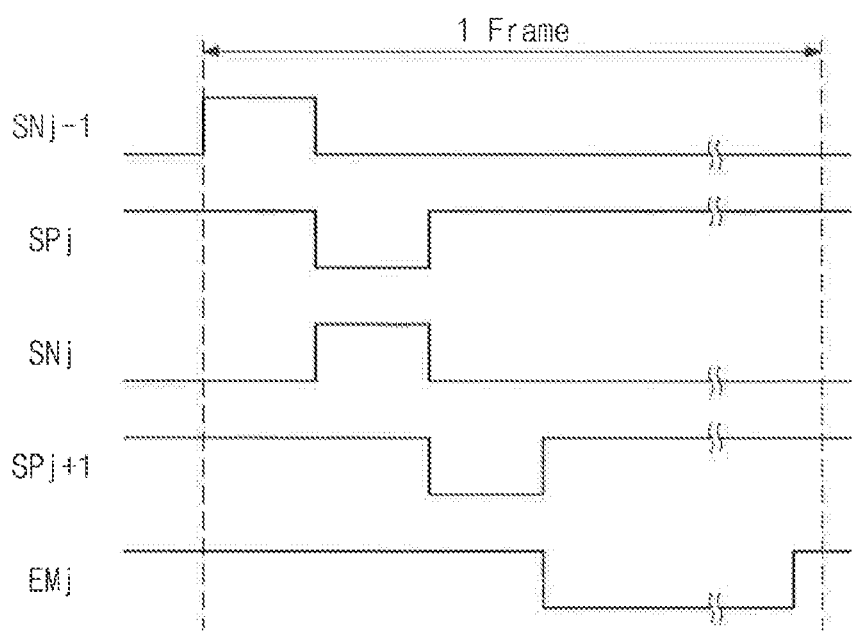
FIG. 3 is a timing diagram illustrating an operation of the pixel of FIG. 2.

FIG. 2 is an equivalent circuit diagram of a pixel according to an exemplary embodiment of the inventive concept, and FIG. 3 is a timing diagram illustrating an operation of the pixel of FIG. 2.

FIG. 2 illustrates an equivalent circuit diagram of a pixel $PX_{ij}$ of the plurality of pixels PX of FIG. 1. The pixel $PX_{ij}$ may be connected to an i-th data line DLi of the data lines DL1 to DLm, a j-th P-type scan line SPLj and a (j+1)-th P-type scan line SPLj+1 of the P-type scan lines SPL1 to SPLn. In addition, the pixel $PX_{ij}$ may be connected to a j-th N-type scan line SNLj, a (j+1)-th N-type scan line SNLj-1 of the N-type scan lines SNL1 to SNLn, and a j-th emission control line ELj of the emission control lines EL1 to ELn. Each of the plurality of pixels PX illustrated in FIG. 1 may have the same or similar circuit configuration as the equivalent circuit of the pixel $PX_{ij}$ illustrated in FIG. 2.

In the present embodiment, a circuit part of the pixel $PX_{ij}$ may include first, second, third, fourth, fifth, sixth and seventh transistors T1, T2, T3, T4, T5, T6 and T7 and a single capacitor Cst. Each of the first, second, fifth, sixth and seventh transistors T1, T2, T5, T6 and T7 may be a P-type transistor having a low-temperature polycrystalline silicon (LTPS) semiconductor layer, and each of the third and fourth transistors T3 and T4 may be an N-type transistor having a semiconductor layer formed of an oxide semiconductor. However, the inventive concept is not limited thereto. In an exemplary embodiment of the inventive concept, at least one of the first to seventh transistors T1 to T7 may be the N-type transistor, and the others of the first to seventh transistors T1 to T7 may be the P-type transistors. For example, the third transistor T3 may be the N-type transistor and the first, second, fourth, fifth, sixth and seventh transistors T1, T2, T4, T5, T6 and T7 may be P-type transistors. In addition, the configuration of the circuit part is not limited to that shown in FIG. 2. For example, the configuration of the circuit part may be variously modified.

Referring to FIG. 2, the pixel PX may include the first to seventh transistors T1, T2, T3, T4, T5, T6 and T7, the capacitor Cst, and a light emitting element ED. In an exemplary embodiment of the inventive concept, the light emitting element ED may be an organic light emitting diode.

For ease of description, the j-th P-type scan line SPLj, the j-th N-type scan line SNLj, the (j-1)-th N-type scan line SNLj-1 and the (j+1)-th P-type scan line SPLj+1 are referred to as a first scan line SPLj, a second scan line SNLj, a third scan line SNLj-1 and a fourth scan line SPLj+1, respectively.

The first to fourth scan lines SPLj, SNLj, SNLj-1 and SPLj+1 may receive scan signals SPj, SNj, SNj-1 and SPj+1, respectively. The scan signals SPj and SPj+1 may turn on/off the second and seventh transistors T2 and T7 corresponding to the P-type transistors. For example, the scan signals SPj and SPj+1 are applied to the gates of the second and seventh transistors T2 and T7. The scan signals SNj and SNj-1 may turn on/off the third and fourth transistors T3 and T4 corresponding to the N-type transistors. For example, the scan signals SNj and SNj-1 are applied to the gates of the third and fourth transistors T3 and T4.

The emission control ELj may receive an emission control signal EMj that can control light emission of the light emitting element ED included in the pixel $PX_{ij}$. The emission control signal EMj may have a different waveform from the waveforms of the scan signals SPj, SPj-1 and SPj+1. The data line DLi may transmit a data signal Di, and the first driving voltage line VL1 may transmit the first driving voltage ELVDD. The data signal Di may have a voltage level that changes in accordance with an image signal inputted to the display device 100. The level of the first driving voltage ELVDD may be substantially constant.

The first transistor T1 may include a first electrode connected to the first driving voltage line VL1 via the fifth transistor T5, a second electrode electrically connected to an anode of the light emitting element ED via the sixth transistor T6, and a gate electrode connected to a first end of the capacitor Cst.

The second transistor T2 may include a first electrode connected to the data line DLi, a second electrode connected to the first electrode of the first transistor T1, and a gate electrode connected to the first scan line SPLj.

The second transistor T2 may be turned-on by the scan signal SPj transmitted through the first scan line SPLj to transmit the data signal Di transmitted from the data line DLi to the first electrode of the first transistor T1. The first transistor T1 may receive the data signal Di through the first electrode by the switching operation of the second transistor T2 and supply a driving current Id to the light emitting element ED.

The third transistor T3 may include a first electrode connected to the gate electrode of the first transistor T1, a second electrode connected to the second electrode of the first transistor T1, and a gate electrode connected to the second scan line SNLj. The first electrode of the third transistor T3 and the gate electrode of the first transistor T1 are connected via a first node GN. The third transistor T3 may be turned-on by the scan signal SNj transmitted through the second scan line SNLj to connect the gate electrode and the second electrode of the first transistor T1 to each other. Thus, when the third transistor T3 is turned-on, the first transistor T1 may operate like a diode.

The fourth transistor T4 may include a first electrode connected to the gate electrode of the first transistor T1, a second electrode connected to the initialization voltage line RL that receives the initialization voltage Vint, and a gate electrode connected to the third scan line SNLj-1. The fourth transistor T4 may be turned-on by the scan signal SNj-1 transmitted through the third scan line SNLj-1 to transmit the initialization voltage Vint to the gate electrode of the first transistor T1. Thus, the gate electrode of the first transistor T1 may be initialized by the initialization voltage Vint.

The fifth transistor T5 may include a first electrode connected to the first driving voltage line VL1, a second electrode connected to the first electrode of the first transistor T1, and a gate electrode connected to the j-th emission control line ELj.

The sixth transistor T6 may include a first electrode connected to the second electrode of the first transistor T1, a second electrode connected to the anode of the light emitting element ED, and a gate electrode connected to the j-th emission control line ELj.

The fifth transistor T5 and the sixth transistor T6 may be turned-on at the same time by the emission control signal EMj transmitted through the j-th emission control line ELj. When the fifth and sixth transistors T5 and T6 are turned-on, a current path may be formed between the first driving voltage line VL1 and the light emitting element ED. For example, the driving current Id may be provided to the light emitting element ED via the sixth transistor T6. When the fifth and sixth transistors T5 and T6 are turned-off, the current path may be blocked.

The seventh transistor T7 may include a first electrode connected to the second electrode of the fourth transistor T4, a second electrode connected to the second electrode of the sixth transistor T6, and a gate electrode connected to the fourth scan line SPLj+1.

The first end of the capacitor Cst may be connected to the gate electrode of the first transistor T1 as described above, and a second end of the capacitor Cst may be connected to the first driving voltage line VL1. A cathode of the light emitting element ED may be connected to a terminal for transmitting the second driving voltage ELVSS. It is to be understood that the structure of the pixel $PX_{ij}$ shown in FIG. 2 is not limited thereto. In an exemplary embodiment of the inventive concept, the number of the transistor(s) and the number of the capacitor(s) in one pixel PX and the connection relation therebetween may be variously modified or changed.

Referring to FIGS. 2 and 3, a high-level scan signal SNj−1 may be supplied through the third scan line SNLj−1 during an initialization period in one frame. When the fourth transistor T4 is turned-on in response to the high-level scan signal SNj−1, the initialization voltage Vint may be transmitted to the gate electrode of the first transistor T1 through the fourth transistor T4. Thus, the first node GN connected to the gate electrode of the first transistor T1 may be initialized by the initialization voltage Vint.

Next, the second transistor T2 may be turned-on when a low-level scan signal SPj is supplied through the first scan line SPLj, and at the same time, the third transistor T3 may be turned-on when a high-level scan signal SNj is supplied through the second scan line SNLj. In this case, the first transistor T1 may be diode-connected by the third transistor T3 that was turned-on and may be biased in a forward direction. Thus, a compensation voltage (Di-th) obtained by subtracting a threshold voltage (Vth) of the first transistor T1 from the data signal Di supplied through the data line DLi may be applied to the gate electrode of the first transistor T1. In other words, a voltage of the first node GN may be the compensation voltage (Di-Vth).

The first driving voltage ELVDD and the compensation voltage (Di-Vth) may be applied to the first and second ends of the capacitor Cst, respectively, and charges corresponding to a difference in voltage between the first and second ends may be stored in the capacitor Cst.

During a bypass period, the seventh transistor T7 may be turned-on by a low-level scan signal SPj+1 supplied through the fourth scan line SPLj+1. A portion of the driving current Id may pass through the seventh transistor T7 turned-on, as a bypass current (Ibp). The bypass period may occur after the initialization period. In addition, the bypass period may occur when the scan signal SPj transitions to a high-level and when the scan signal SNj transitions to a low level.

Next, during an emission period, the emission control signal EMj supplied from the j-th emission control line ELj may be changed from a high level to a low level. During the emission period, which may occur after the bypass period, the fifth transistor T5 and the sixth transistor T6 may be turned-on by the low-level emission control signal EMj. Thus, the driving current Id may be generated by a difference between the first driving voltage ELVDD and a gate voltage of the gate electrode of the first transistor T1. In addition, the driving current Id may be supplied to the light emitting element ED through the sixth transistor T6. Thus, a current Ied may flow through the light emitting element ED. As a result, the light emitting element ED may emit light.

Figure 4:
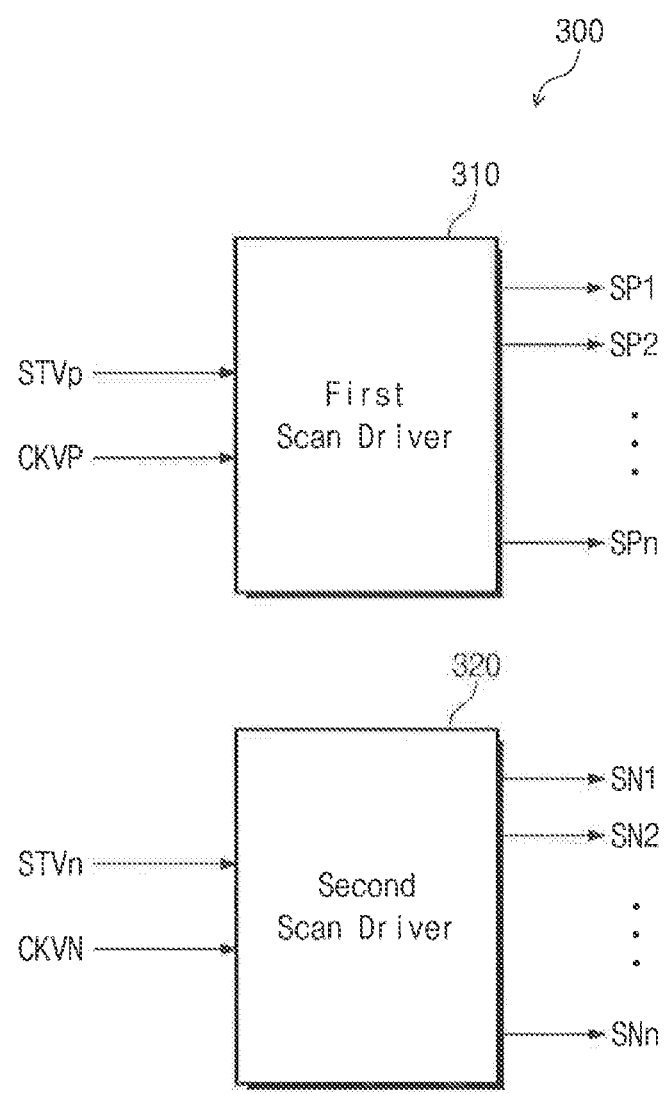
FIG. 4 is a block diagram illustrating a scan driver according to an exemplary embodiment of the inventive concept.
Figure 5:
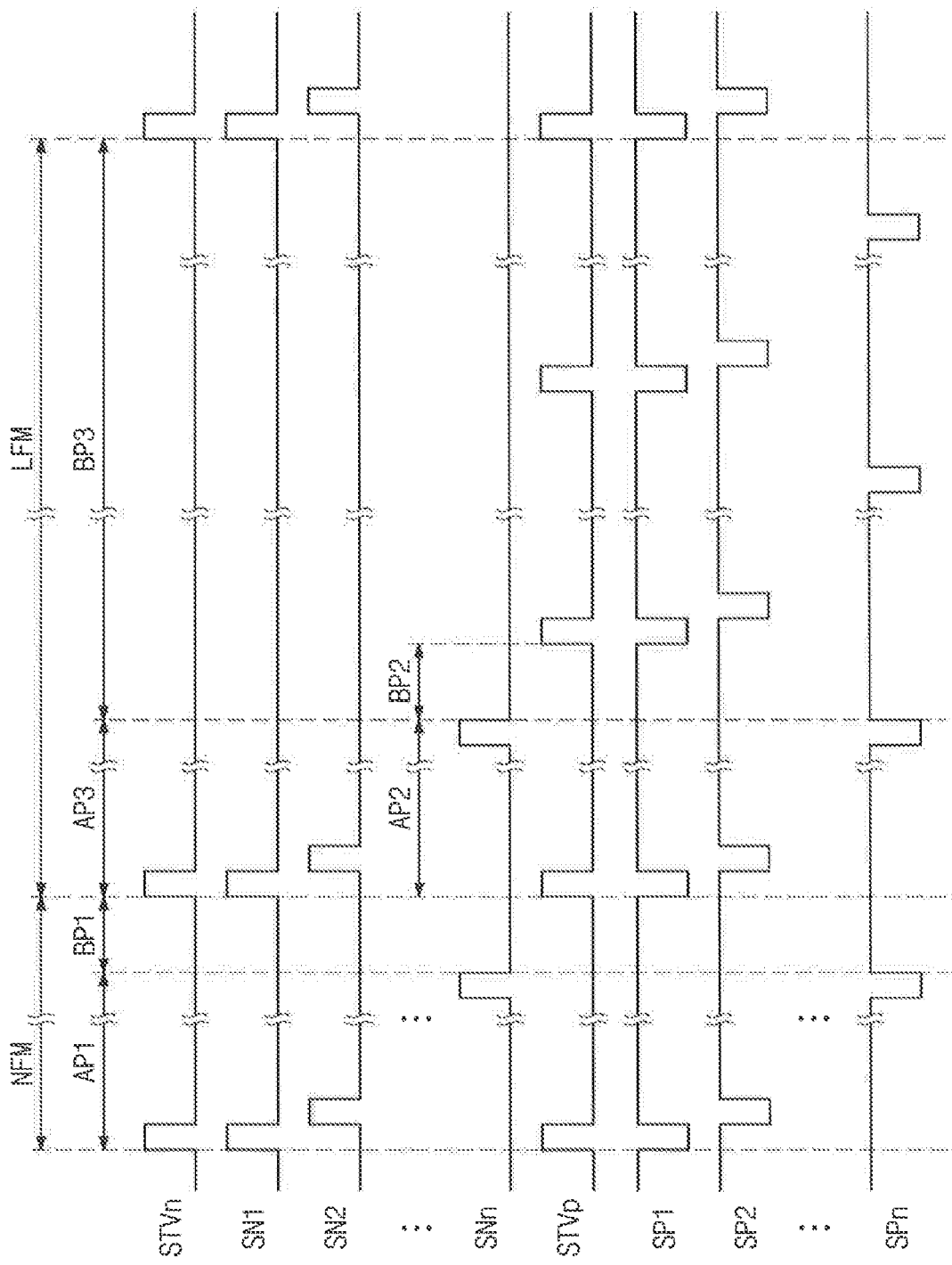
FIG. 5 is a waveform diagram illustrating input and output signals of first and second scan drivers of FIG. 4.

FIG. 4 is a block diagram illustrating a scan driver according to an exemplary embodiment of the inventive concept, and FIG. 5 is a waveform diagram illustrating input and output signals of first and second scan drivers of FIG. 4.

Referring to FIGS. 4 and 5, the scan driver 300 may include a first scan driver 310 and a second scan driver 320. In an exemplary embodiment of the inventive concept, the scan control signal SCS provided from the signal controller 200 of FIG. 1 to the scan driver 300 may include first and second start signals STVp and STVn and first and second clock signals CKVP and CKVN. The first scan driver 310 may receive the first start signal STVp and the first clock signal CKVP and may output a plurality of first scan signals SP1 to SPn. The plurality of first scan signals SP1 to SPn may be scan signals applied to first to n-th P-type scan lines SPL1 to SPLn, respectively. Each of the plurality of first scan signals SP1 to SPn may be a scan signal provided to the gate electrodes of the first, second, fifth, sixth and seventh transistors T1, T2, T5, T6 and T7 (see FIG. 2) of a corresponding pixel PX.

The second scan driver 320 may receive the second start signal STVn and the second dock signal CKVN and may output a plurality of second scan signals SN1 to SNn. The plurality of second scan signals SN1 to SNn may be scan signals applied to first to n-th N-type scan lines SNL1 to SNLn, respectively. Each of the plurality of second scan signals SN1 to SNn may be a scan signal provided to the gate electrodes of the third and fourth transistors T3 and T4 (see FIG. 2) of a corresponding pixel PX.

In a normal operation mode NFM, the first and second scan drivers 310 and 320 may respectively receive the first and second start signals STVp and STVn, each of which has a reference frequency (e.g., 60 Hz). In other words, the frequencies of the first and second start signals STVp and STVn may be equal to each other in the normal operation mode NFM. During one frame of the normal operation mode NFM, the plurality of first scan signals SP1 to SPn may be sequentially activated to have a low period, and the plurality of second scan signals SN1 to SNn may be sequentially activated to have a high period.

In the normal operation mode NFM, the one frame may include a first active period AP1 and a first blank period BP1. The first active period AP1 may precede the first blank period BP1. In the first active period AP1, the plurality of first scan signals SP1 to SPn may be sequentially activated to a low level, and the plurality of second scan signals SN1 to SNn may be sequentially activated to a high level. In the first blank period BP1, all of the plurality of first scan signals SP1 to SPn may be maintained at a high level, and all of the plurality of second scan signals SN1 to SNn may be maintained at a low level.

In a low-frequency operation mode LFM, the first start signal STVp may have the reference frequency, and the second start signal ST In may have a frequency (e.g., 1 Hz) lower than the reference frequency. In other words, the frequencies of the first and second start signals STVp and STVn may be different from each other in the low-frequency operation mode LFM.

Thus, in the low-frequency operation mode LFM, the plurality of first scan signals SP1 to SPn may be sequentially activated to the low level during a second active period AP2 and may be maintained at the high level during a second blank period BP2. For example, the second active period AP2 may have a time width corresponding to that of the first active period AP1 of the normal operation mode NFM, and the second blank period BP2 may have a time width corresponding to that of the first blank period BP1 of the normal operation mode NFM.

Additionally, in the low-frequency operation mode LFM, the plurality of second scan signals SN1 to SNn may be sequentially activated to the high level during a third active period AP3 and may be maintained at the low level during a third blank period BP3. In this case, the third active period AP3 may have a time width corresponding to that of the second active period AP2. The third blank period BP3 may have a time width greater than that of the second blank period BP2. In the low-frequency operation mode LFM, when the first start signal STVp has the frequency of 60 Hz and the second start signal STVn has the frequency of 1 Hz, the third blank period BP3 may have the time width which is 60 times greater than that of the second blank period BP2. As can be seen, when the frequency of the second start signal STVn is lowered in the low-frequency operation mode the active period AP3 remains the same at that of the normal operation mode NFM, but the blank period BP3 increases as compared to that of the normal operation mode NFM.

For example, when the frequency of the second start signal STVn is changed to 15 Hz or 30 Hz, the time width (or length) of the third active period AP3 may not be changed but the time width (or length) of the third blank period BP3 may be changed. In other words, the time width (or length) of the third blank period BP3 may increase as the frequency of the second start signal STVn decreases.

The emission control signals provided to the emission control lines EL1 to ELn may also have the reference frequency in the low-frequency operation mode LFM. However, the inventive concept is not limited thereto. For example, the emission control signals may have a frequency different from the reference frequency in the low-frequency operation mode LFM. In another exemplary embodiment of the inventive concept, the plurality of first scan signals SP1 to SPn and the emission control signals may have frequencies lower than the reference frequency in the low-frequency operation mode LFM. According to another exemplary embodiment of the inventive concept, in the low-frequency operation mode LFM, the plurality of first scan signals SP1 to SPn and the emission control signals may have a first frequency lower than the reference frequency, and the plurality of second scan signals SN1 to SNn may have a second frequency lower than the first frequency.

Referring again to FIG. 2, for example, in the low-frequency operation mode LFM, the first, second, fifth, sixth and seventh transistors T1, T2, T5, T6 and T7 may be driven at the reference frequency (e.g., 60 Hz), and the third and fourth transistors T3 and T4 may be driven at a frequency (e.g., 1 Hz) lower than the reference frequency.

Figure 6:
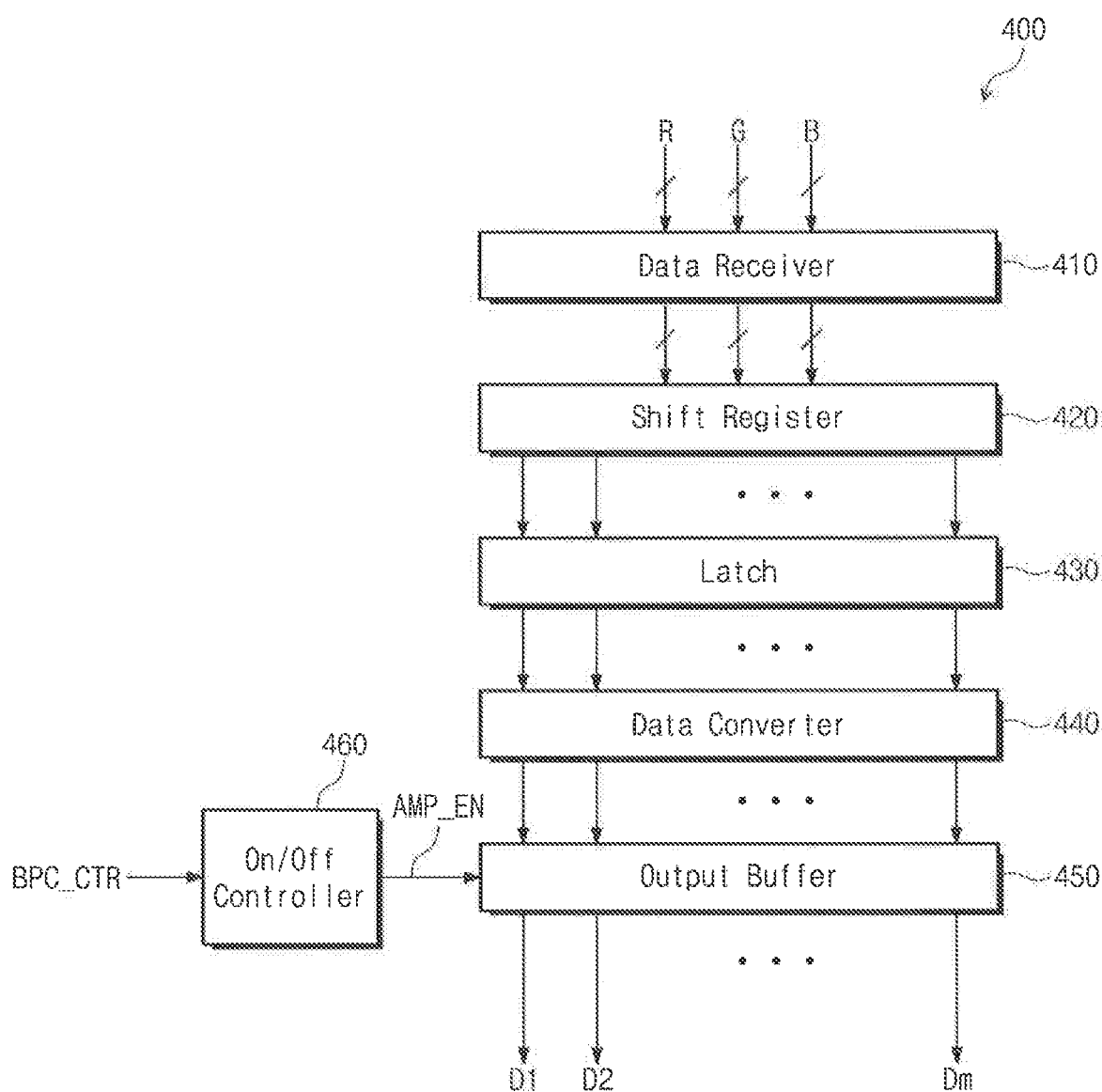
FIG. 6 is a block diagram illustrating a data driver according to an exemplary embodiment of the inventive concept.
Figure 7:
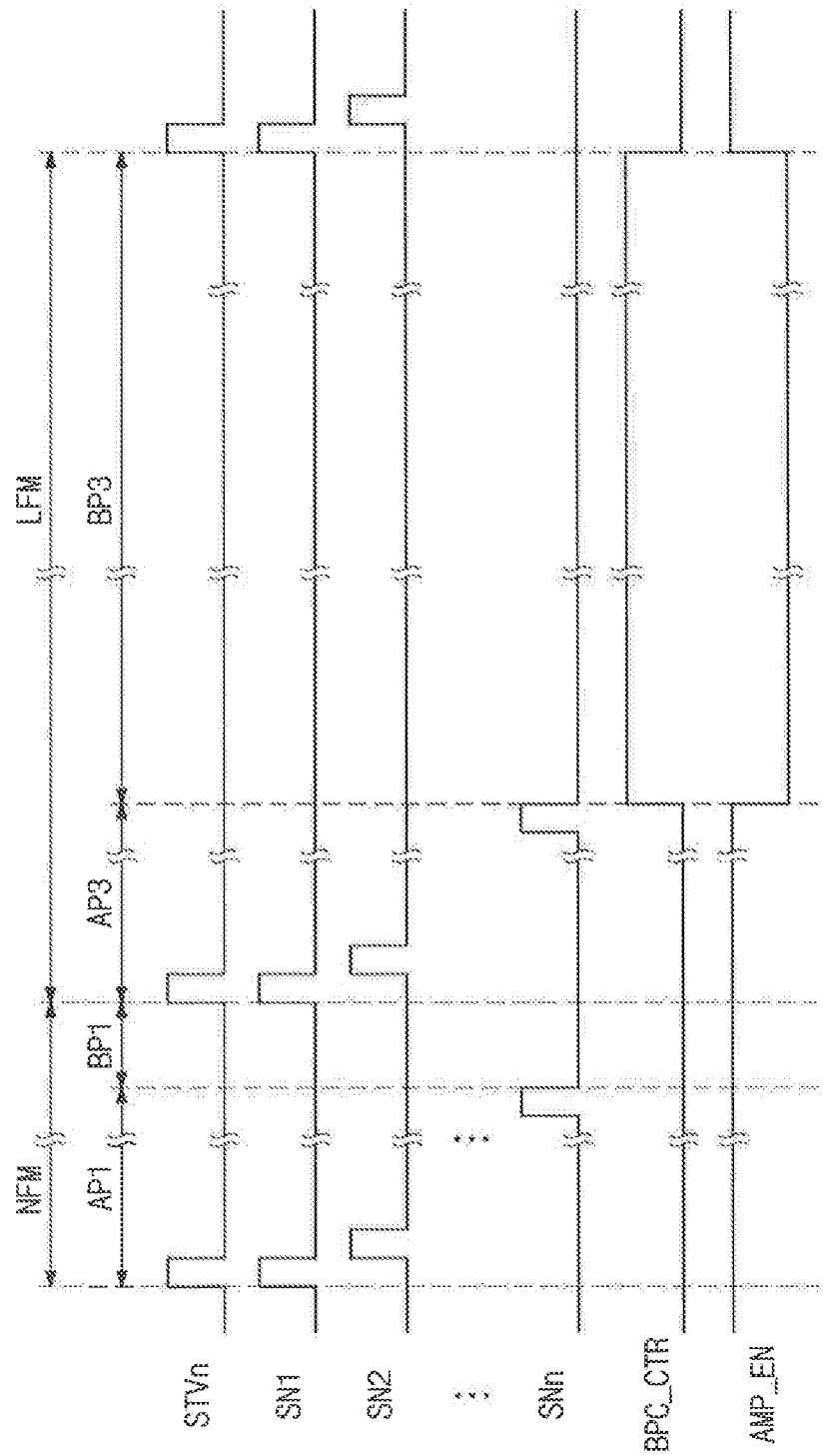
FIG. 7 is a waveform diagram illustrating a change in a power control signal according to an operation mode.

FIG. 6 is a block diagram illustrating a data driver according to an exemplary embodiment of the inventive concept, and FIG. 7 is a waveform diagram illustrating a change in a power control signal according to an operation mode.

Referring to FIG. 6, the data driver 400 may include a data receiver 410, a shift register 420, a latch 430, a data converter 440, and an output buffer 450.

The data receiver 410 may receive the image data signal RGB from the signal controller 200 (see FIG. 1) and may convert the image data signal RGB into signals suitable for the data driver 400. The data receiver 410 may supply the converted signals to the shift register 420. The shift register 420 may align the image data signal, supplied from the data receiver 410, into image data in a line unit in response to the data control signal DCS supplied from the signal controller 200.

The latch 430 may store the image data in the line unit, supplied from the shift register 420.

The data converter 440 may receive the image data in the line unit from the latch 430 and may convert the image data into data signals D1 to Dm in a line unit on the basis of a plurality of gamma voltages. Here, the image data may be digital signals, and the data signals D1 to Dm may be analog voltages.

The data signals D1 to Dm may be supplied to the data lines DL1 to DLm (see FIG. 1) of the display panel 100 through the output buffer 450. The output buffer 450 may store the data signals D1 to Dm for a certain time and may output the data signals D1 to Dm to the data lines DL1 to DLm at the same time.

In an exemplary embodiment of the inventive concept, the data driver 400 may further include an on/off controller 460 for low-frequency operation. The on/off controller 460 may receive the power control signal BPC_CTR from the low-frequency driving controller 500. The on/off controller 460 may output an amp control signal AMP_EN for controlling on/off operation of the output buffer 450, depending on the power control signal BPC_CTR.

An output terminal of the output buffer 450 may include operational amplifiers (e.g., op-amps) that are connected to the data lines DL1 to DLm in one-to-one correspondence. Each of the op-amps may be turned on/off by the amp control signal AMP_EN.

Referring to FIGS. 6 and 7, the power control signal BPC_CTR received from the low-frequency driving controller 500 may have a first state in the normal operation mode NFM. In other words, the power control signal BPC_CTR may have a low-level. When the on/off controller 460 receives the power control signal BPC_CTR of the first state, the on/off controller 460 may output the amp control signal AMP_EN of a second state, which is capable of turning-on the op-amps. The second state of the amp control signal AMP_EN may correspond to when the amp control signal AMP_EN has a high-level. Thus, the data signals D1 to Dm provided to the output buffer 450 may be outputted to the data lines DL1 to DLm through the op-amps.

When the operation mode of the display device 1000 is changed to the low-frequency operation mode LFM, the power control signal BPC_CTR may have the second state during the third blank period BP3. For example, when the first state is a low state, the second state may be a high state.

The on/off controller 460 may receive the power control signal BPC_CTR of the second state during the third blank period BP3 and output the amp control signal AMP_EN of the first state, which turns-off the op-amps. When the op-amps are turned-off by the amp control signal AMP_EN, the data signals D1 to Dm provided to the output buffer 450 are not outputted through the op-amps.

Thus, the output buffer 450 may operate at a frequency lower than the reference frequency in the low frequency operation mode LFM by the amp control signal AMP_EN. As a result, power consumed in the data driver 400 may be reduced.

Figure 8:
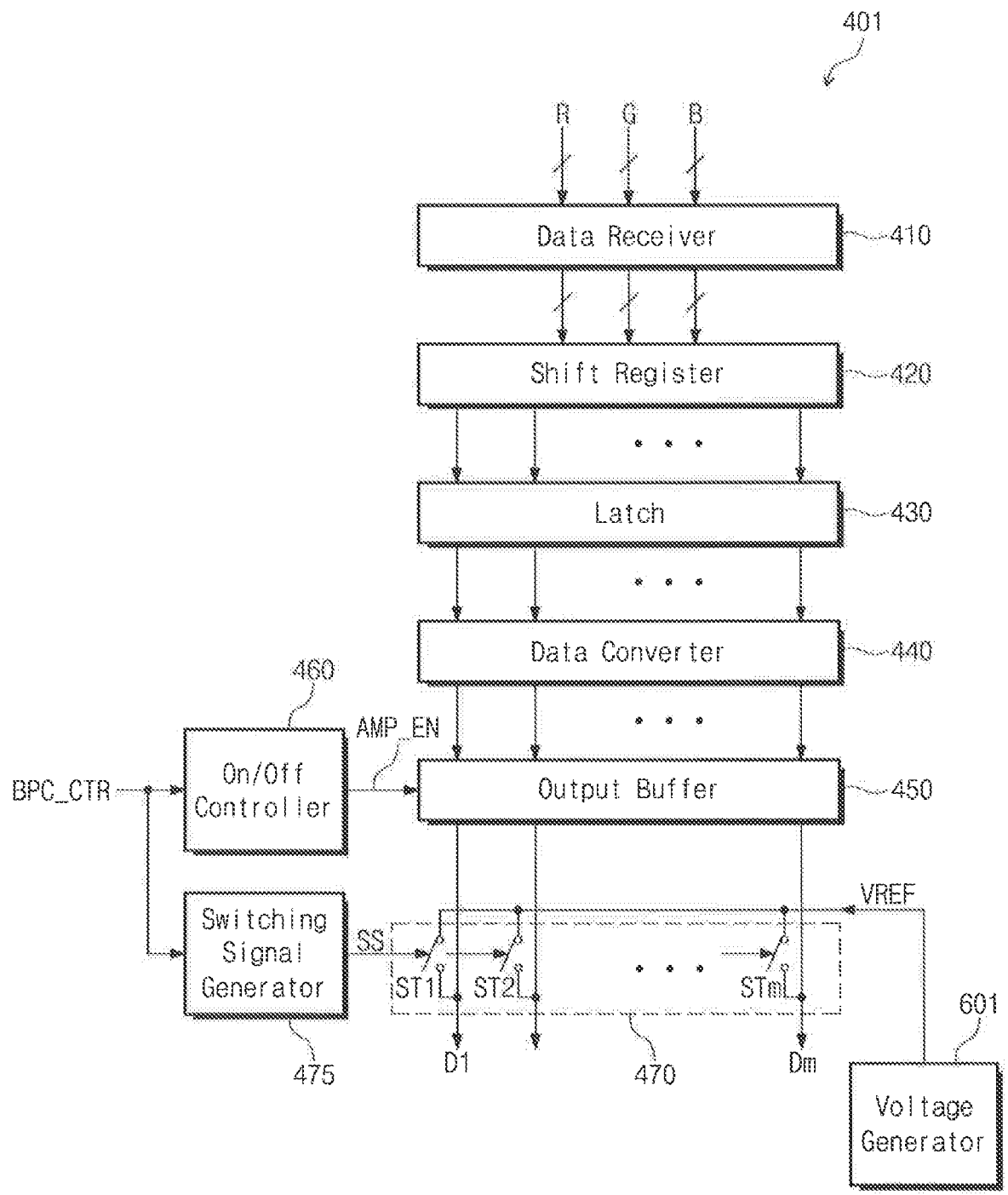
FIG. 8 is a block diagram illustrating a data driver according to another exemplary embodiment of the inventive concept.
Figure 9:
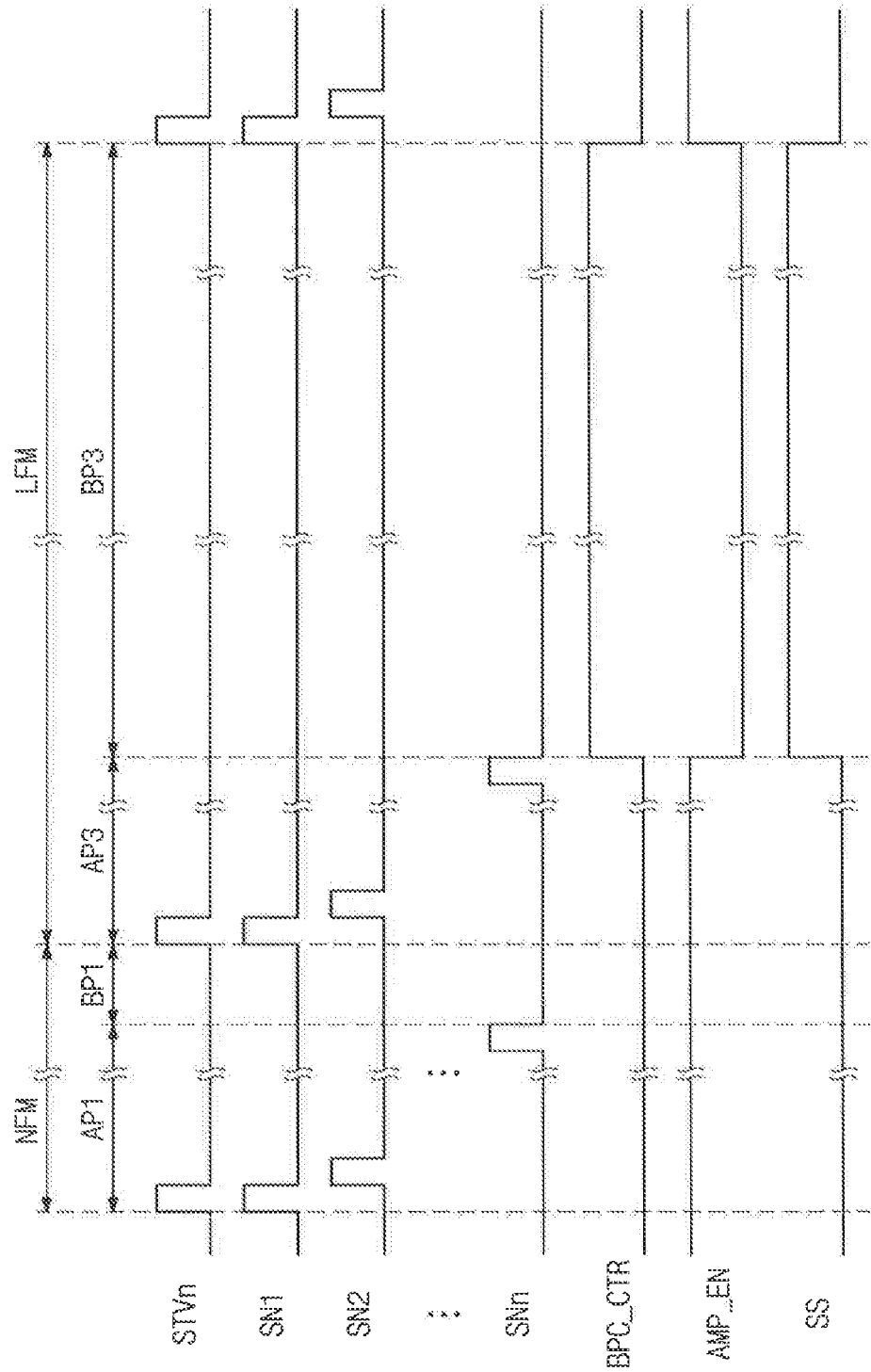
FIG. 9 is a waveform diagram illustrating a change in a power control signal according to an operation mode.

FIG. 8 is a block diagram illustrating a data driver according to another exemplary embodiment of the inventive concept, and FIG. 9 is a waveform diagram illustrating a change in a power control signal according to an operation mode.

Referring to FIG. 8, a data driver 401 according to the present embodiment may further include a switching circuit 470 and a switching signal generator 475.

The switching circuit 470 may be connected in parallel to the output terminal of the output buffer 450. For example, the switching circuit 470 may include a plurality of switching elements ST1 to STm connected to output terminals of the op-amps included in the output buffer 450. The plurality of switching elements ST1 to STm may be turned on or off in response to a switching signal SS.

Each of the plurality of switching elements ST1 to STm may include a first electrode connected to the output terminal of a corresponding op-amp, a control electrode configured to receive the switching signal SS, and a second electrode configured to receive a reference voltage VREF. The reference voltage VREF may be a voltage outputted from a voltage generator 601. In other words, the voltage generator 601 according to another exemplary embodiment of the inventive concept may further generate the reference voltage VREF to be supplied to the data driver 400, in addition to the initialization voltage Vint and the first and second driving voltages ELVDD and ELVSS illustrated in FIG. 1.

The switching signal generator 475 may generate the switching signal SS in response to the power control signal BPC_CTR and may provide the generated switching signal SS to the switching circuit 470 to control on/off operation of the plurality of switching elements ST1 to STm.

Referring to FIGS. 8 and 9, the on/off controller 460 and the switching signal generator 475 may receive the power control signal BPC_CTR of the first state in the normal operation mode NFM. The on/off controller 460 may output the amp control signal AMP_EN of the second state for turning-on the op-amps, and the switching signal generator 475 may output the switching signal SS of the first state for turning-off the plurality of switching elements ST1 to STm. Thus, the data signals D1 to Dm from the output buffer 450 may be outputted to the data lines DL1 to DLm through the op-amps in the normal operation mode NFM. In the normal operation mode NFM, the plurality of switching elements ST1 to STm may be turned-off in response to the switching signal SS of the first state.

In addition, in the low-frequency operation mode LFM, the on/off controller 460 and the switching signal generator 475 may receive the power control signal BPC_CTR of the second state during the third blank period BP3. The on/off controller 460 may output the amp control signal AMP_EN of the first state for turning-off the op-amps during the third blank period BP3. In addition, the switching signal generator 475 may output the switching signal SS of the second state for turning-on the plurality of switching elements ST1 to STm during the third blank period BP3. As a result, in the low-frequency operation mode the op-amps may be turned-off by the amp control signal AMP_EN during the third blank period BP3, and thus, the data signals D1 to Dm may not be outputted to the data lines DL1 to DLm through the op-amps.

In the low-frequency operation mode the switching elements ST1 to STm may be turned-on in response to the switching signal SS of the second state. Thus, in the low-frequency operation mode LFM, the reference voltage VREF supplied to the switching circuit 470 may be outputted to the data lines DL1 to DLm through the plurality of switching elements ST1 to STm turned-on. In other words, in the third blank period BP3 of the low-frequency operation mode LFM, the reference voltage VREF is output from the data driver 401.

In an exemplary embodiment of the inventive concept, the switching signal SS may be an inverted signal of the amp control signal AMP_EN. In other words, the switching signal SS may have a level opposite that of the amp control signal AMP_EN.

Figure 10:
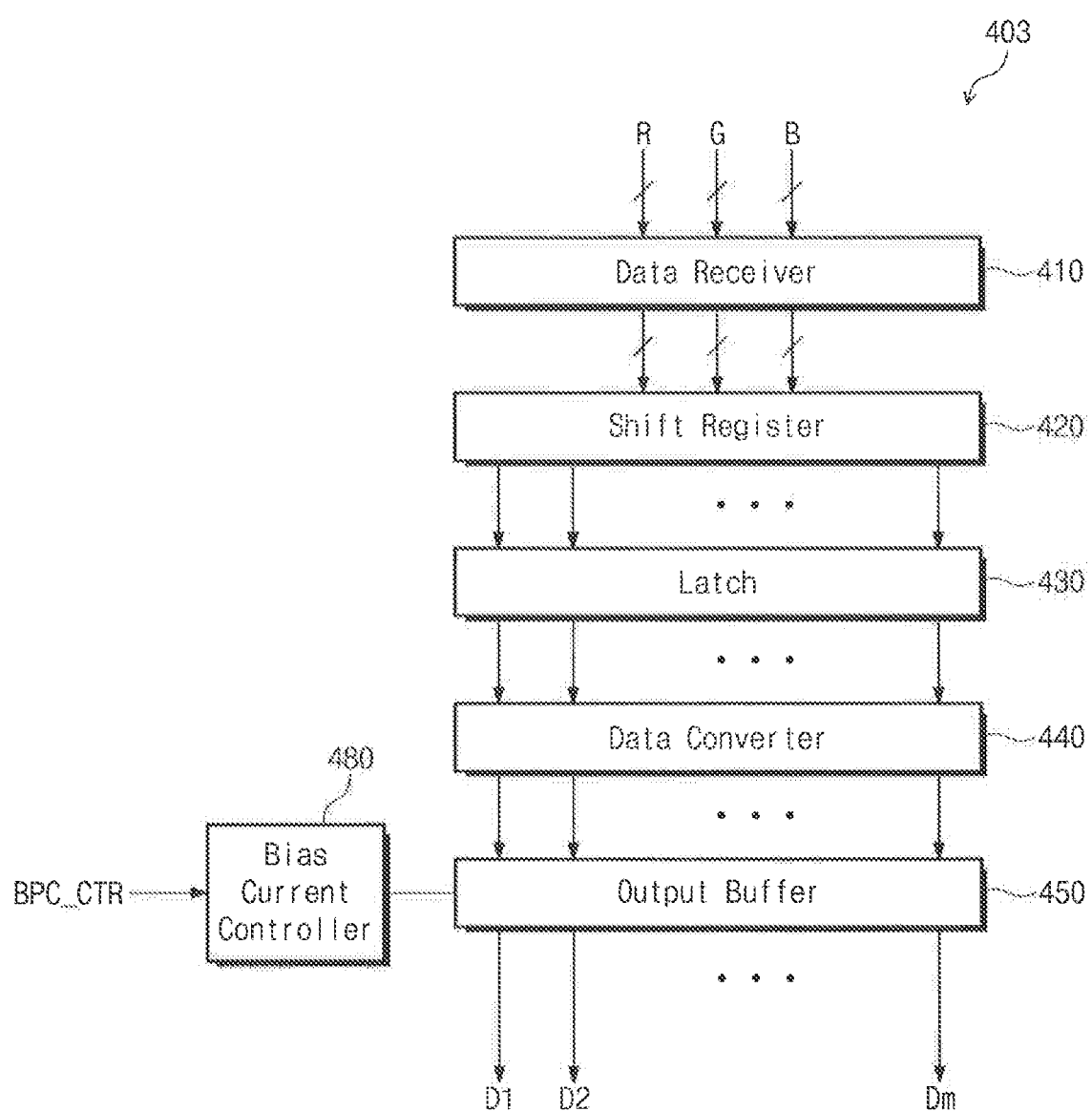
FIG. 10 is a block diagram illustrating a data driver according to another exemplary embodiment of the inventive concept.
Figure 11:
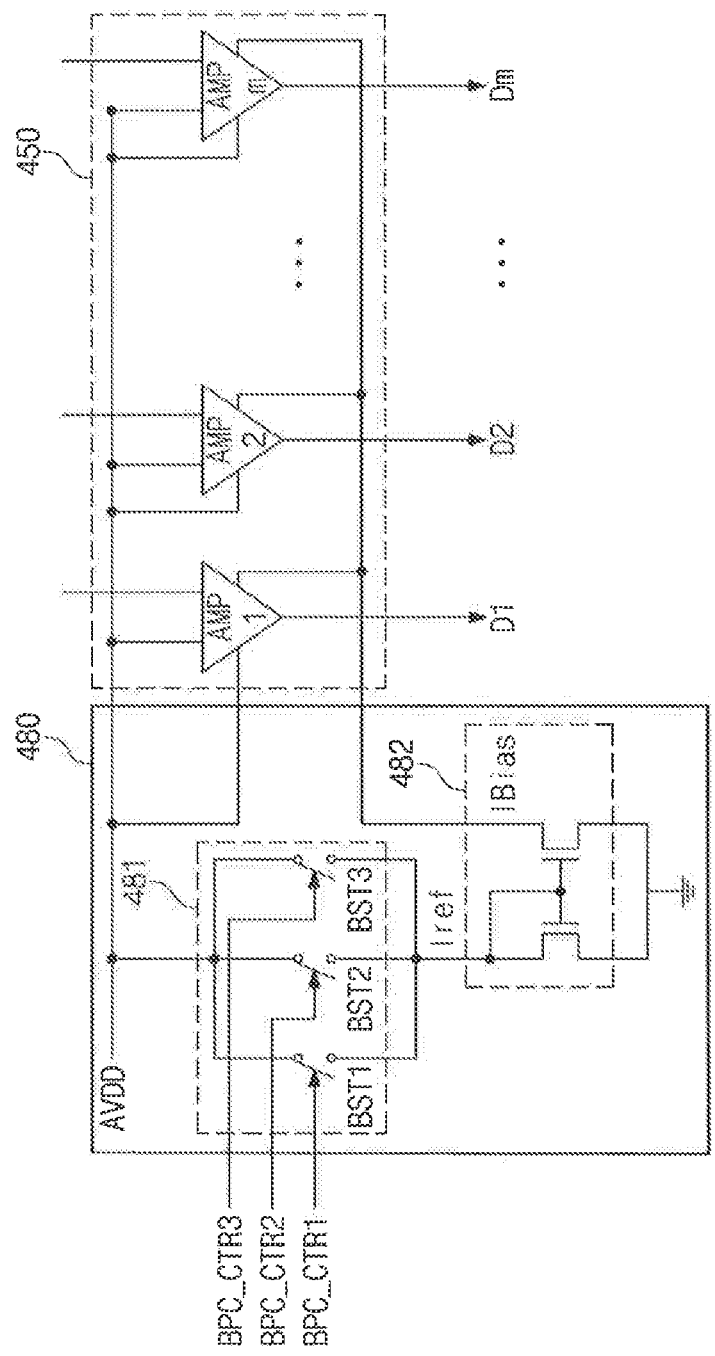
FIG. 11 is a circuit diagram of a bias current controller illustrated in FIG. 10.
Figure 12:
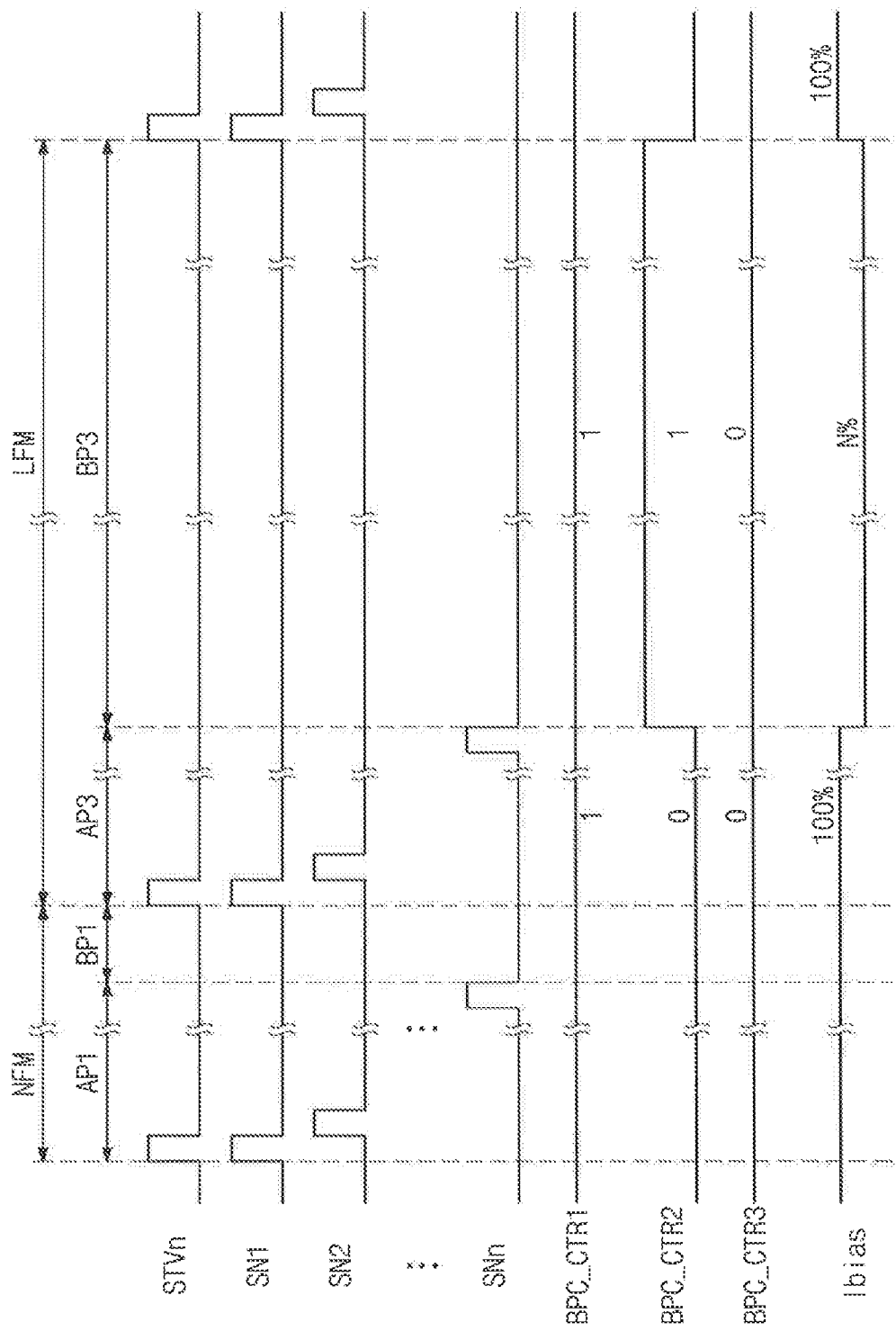
FIG. 12 is a waveform diagram illustrating changes in bias current and first to third power control signals according to an operation mode.

FIG. 10 is a block diagram illustrating a data driver according to another exemplary embodiment of the inventive concept, and FIG. 11 is a circuit diagram of a bias current controller illustrated in FIG. 10. FIG. 12 is a waveform diagram illustrating changes in bias current and first to third power control signals according to an operation mode.

Referring to FIGS. 10 and 11, a data driver 403 according to another exemplary embodiment of the inventive concept may include a bias current controller 480 for controlling a bias current IBias of the output buffer 450. The bias current controller 480 may receive the power control signal BPC_CTR from the low frequency driving controller 500 (see FIG. 1) and may control the bias current IBias of the output buffer 450 on the basis of the power control signal BPC_CTR. The output buffer 450 may include a plurality of op-amps AMP1 to AMPm, and bias currents IBias of the plurality of op-amps AMP1 to AMPm may have substantially the same magnitude.

The bias current controller 480 may include a current control circuit 481 and a current mirror circuit 482. The current control circuit 481 may include a plurality of switching elements. In an exemplary embodiment of the inventive concept, the current control circuit 481 may include three switching elements (e.g., first, second and third switching elements BST1, BST2 and BST3). However, the number of the switching elements included in the current control circuit 481 is not limited thereto. For example, the current control circuit 481 may include more or less than three switching elements.

When the current control circuit 481 includes the first to third switching elements BST1 to BST3, the power control signal BPC_CTR may include first, second and third current control signals BPC_CTR1, BPC_CTR2 and BPC_CTR3. When the number of the switching elements included in the current control circuit 481 is changed, the number of the current control signals may also be changed. For example, when there are four switching elements the number of the current control signals may be four.

The first to third switching elements BST1, BST2 and BST3 may receive the first to third current control signals BPC_CTR1, BPC_CTR2 and BPC_CTR3, respectively. The first to third switching elements BST1, BST2 and BST3 may be turned-on or turned-off in response to the first to third current control signals BPC_CTR1, BPC_CTR2 and BPC_CTR3, respectively.

A magnitude of a reference current Iref outputted from an output terminal of the current control circuit 481 may be changed depending on switching operations of the first to third switching elements BST1 to BST3. The current control circuit 481 may be connected to the output buffer 450 through the current mirror circuit 482. By the current mirror circuit 482, the bias current IBias of the output buffer 450 may be controlled to have the same magnitude as the reference current Iref. The current mirror circuit 482 may include two transistors having their gates connected to each other. The reference current Iref may be applied to the gates of the two transistors. A power supply voltage AVM may be input to the current control circuit 481 and the current mirror circuit 482. For example, a power supply voltage AVDD may be applied to terminals of the first to third switching elements BST1, BST2 and BST3. For example, when the first and second switching elements BST1 and BST2 are closed, the reference current Iref may have a greater magnitude than when only the first switching element BST1 is closed.

Referring to FIGS. 11 and 12, in the normal operation mode NFM, operations of the first to third switching elements BST1 to BST3 may be controlled to allow the bias current IBias to have a preset magnitude. For example, when the first current control signal BPC_CTR1 has a first state and the second and third current control signals BPC_CTR2 and BPC_CTR3 have a second state, the bias current IBias may have a magnitude of 100% of the preset magnitude. Here, the first state may be a logic "1" state, and the second state may be a logic "0" state.

In the low-frequency operation mode LFM, operations of the first to third switching elements BST1 to BST3 may be controlled to allow the bias current IBias to have N % of the preset magnitude during the third blank period BP3. Here, 'N' may be a number less than 100.

The magnitude of the reference current Iref may be changed by adjusting the states of the first to third current control signals BPC_CTR1 to BPC_CTR3 applied to the first to third switching elements BST1 to BST3. For example, when the first and second current control signals BPC_TR1 and BPC_CTR2 have the first state and the third current control signal. BPC_CTR3 has the second state during the third blank period BP3, the magnitude of the reference current Iref may be changed. The bias current IBias may have a magnitude corresponding to that of the changed reference current Iref. For example, the magnitude of the bias current IBias may be 50% of the preset magnitude in the low-frequency operation mode LFM.

As described above, in the low-frequency operation mode LFM, power consumed in the data driver 403 may be reduced by adjusting the bias current IBias of the output buffer 450.

A structure in which the data driver 400, 401 or 403 includes both the bias current controller 480 and the on/off controller 460 is not illustrated in FIGS. 6 to 12. However, in exemplary embodiments of the inventive concept, the bias current controller 480 and the on/off controller 460 may be included together in the data driver, and one of the bias current controller 480 and the on/off controller 460 may be selectively operated in the low-frequency operation mode LFM.

Figure 13:
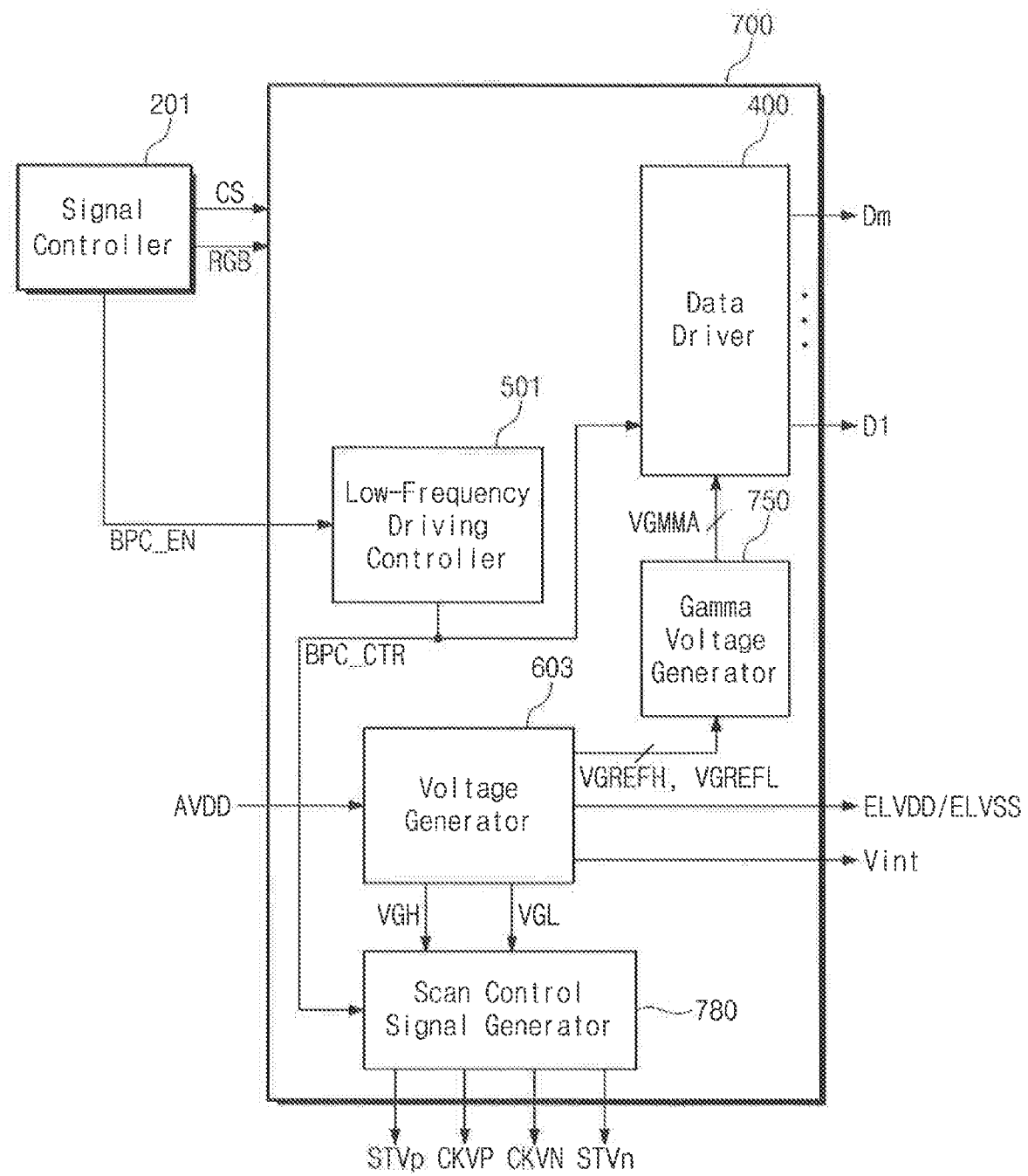
FIG. 13 is a block diagram illustrating an integrated chip according to an exemplary embodiment of the inventive concept.

FIG. 13 is a block diagram illustrating an integrated chip according to an exemplary embodiment of the inventive concept.

Referring to FIG. 13, an integrated chip 700 according to an exemplary embodiment of the inventive concept may include a low-frequency driving controller 501, a data driver 400, a voltage generator 603, a scan control signal generator 780, and a gamma voltage generator 750.

The low-frequency driving controller 501, the data driver 400 and the voltage generator 603 in FIG. 13 may have the same components and functions as the low-frequency driving controller 500, the data driver 400 and the voltage generator 600 in FIG. 1, respectively.

A signal controller 201 may supply a control signal CS and an image data signal RGB to the integrated chip 700. The control signal CS may include a first control signal supplied to the data driver 400 and a second control signal supplied to the scan control signal generator 780. In addition, the signal controller 201 may output a power control enable signal BPC_EN to the low-frequency driving controller 501.

In FIG. 13, the signal controller 201 is not included in the integrated chip 700. However, the inventive concept is not limited thereto. For example, the signal controller 201 may be included in the integrated chip 700.

The low-frequency driving controller 501 may output a power control signal BPC_CTR for driving the data driver 400 and the scan control signal generator 780 in a low-frequency operation mode, in response to the power control enable signal BPC_EN.

A process in which the data driver 400 operates in the low-frequency operation mode in response to the power control signal BPC_CTR may be the same as described above, and thus, detailed descriptions thereto will be omitted.

Referring to FIGS. 4, 5 and 13, the scan control signal generator 780 may generate the first and second start signals STVp and STVn and the first and second clock signals CKVP and CKVN in response to the power control signal BPC_CTR provided from the low-frequency driving controller 501.

In the normal operation mode NFM, the power control signal BPC_CTR may be generated in the first state, and thus, the scan control signal generator 780 may generate the first and second start signals STVp and STVn and the first and second clock signals CKVP and CKVN, which have the reference frequency. Thus, the first scan driver 310 receiving the first start signal STVp and the first clock signal CKVP and the second scan driver 320 receiving the second start signal STVn and the second clock signal CKVN may operate at the reference frequency.

In addition, the power control signal BPC_CTR may be generated in the second state during the third blank period BP3 in the low-frequency operation mode LFM. In this case, the first start signal STVp and the first clock signal CKCP of the scan control signal generator 780 may have the reference frequency regardless of the state of the power control signal BPC_CTR. However, the second start signal STVn and the second clock signal CKVN may be converted into signals having frequencies lower than the reference frequency in response to the power control signal BPC_CTR of the second state. For example, the second start signal STVn and the second clock signal CKVN may have frequencies of 1 Hz in the low-frequency operation mode LFM.

Thus, in the low-frequency operation mode LFM, the first scan driver 310 may operate at the reference frequency and the second scan driver 320 may operate at the frequency lower than the reference frequency.

The voltage generator 603 of FIG. 13 may provide a gamma reference voltage to the gamma voltage generator 750. The gamma reference voltage may include a high gamma reference voltage VGREFH and a low gamma reference voltage VGREFL. The voltage generator 603 may receive the power supply voltage AVDD and output high and low voltages VGH and VGL to the scan control signal generator 780.

The gamma voltage generator 750 may receive the high gamma reference voltage VGREFH and the low gamma reference voltage VGREFL and may output a plurality of gamma voltages VGMMA between the high gamma reference voltage VGREFH and the low gamma reference voltage VGREFL. The plurality of gamma voltages VGMMA may be provided to the data driver 400. The data converter 440 (see FIG. 6) of the data driver 400 may generate analog data signals D1 to Dm on the basis of the plurality of gamma voltages VGMMA.

Figure 14:
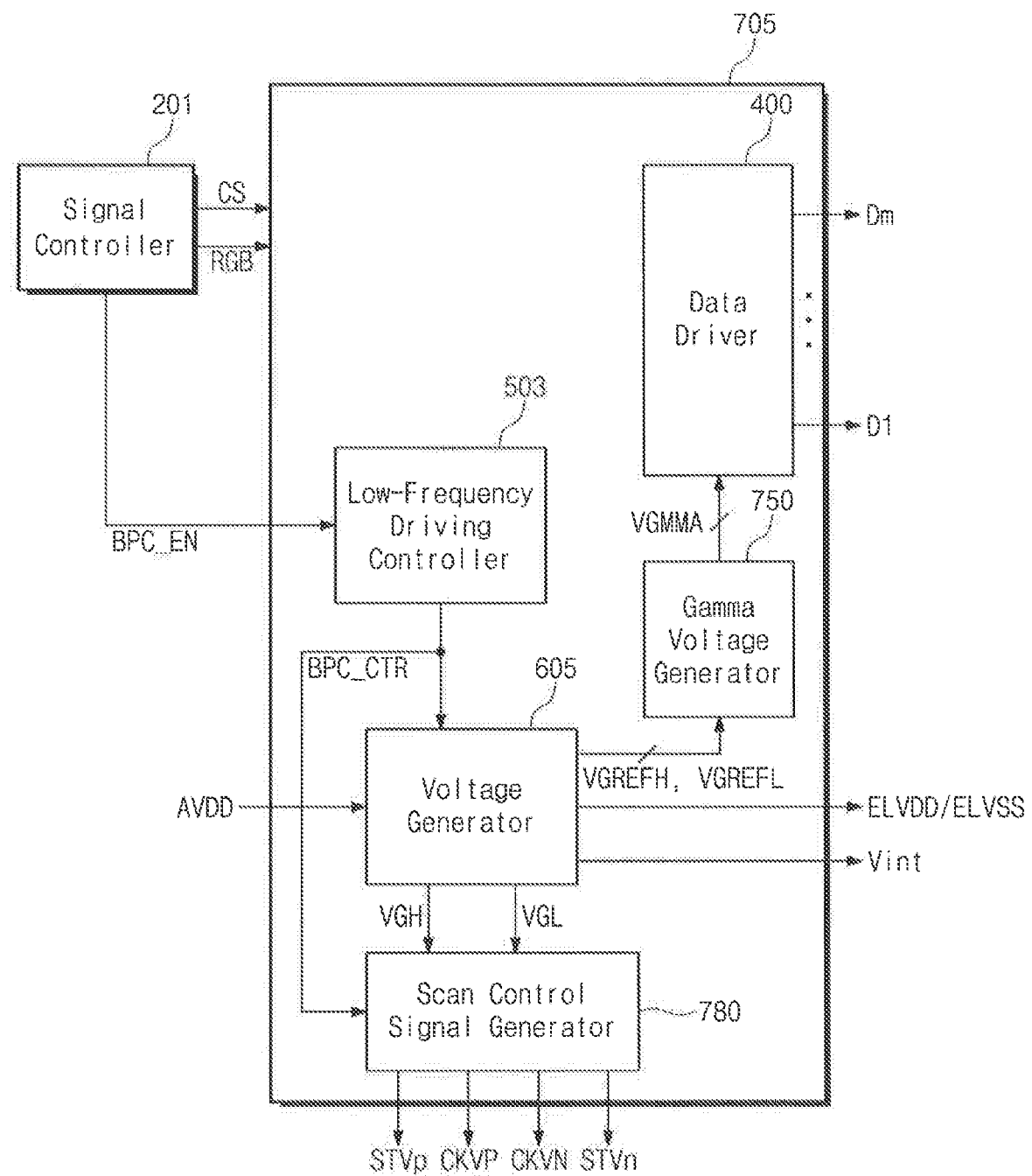
FIG. 14 is a block diagram illustrating an integrated chip according to another exemplary embodiment of the inventive concept.

FIG. 14 is a block diagram illustrating an integrated chip according to another exemplary embodiment of the inventive concept.

Referring to FIG. 14, an integrated chip 705 according to another exemplary embodiment of the inventive concept may include a low-frequency driving controller 503 for driving a voltage generator 605 and the scan control signal generator 780 in the low-frequency operation mode in response to the power control enable signal BPC_EN. In this embodiment, the low-frequency driving controller 503 may not be used to drive the data driver 400.

The low-frequency driving controller 503 may provide the power control signal BPC_CTR to the voltage generator 605 and the scan control signal generator 780. The voltage generator 605 and the scan control signal generator 780 may operate in the low-frequency operation mode in response to the power control signals BPC-CTR.

A method of operating the scan control signal generator 780 in the low-frequency operation mode may be the same as that described with reference to FIG. 13, and thus, detailed descriptions thereto will be omitted.

The voltage generator 605 may receive the power control signal BPC_CTR and may control a magnitude of a voltage, outputted from the voltage generator 605, in response to the power control signal BPC_CTR. In an exemplary embodiment of the inventive concept, the voltage generator 605 may control an output of the initialization voltage Vint.

The power control signal BPC_CTR may have the first state in the normal operation mode NFM. When the voltage generator 605 receives the power control signal BPC_CTR of the first state, the voltage generator 605 may output the initialization voltage Vint having a preset magnitude. For example, the initialization voltage Vint may be about −4.5V.

When the operation mode of the display device 1000 is changed to the low-frequency operation mode LFM, the power control signal BPC_CTR may have the second state during the third blank period BP3. For example, when the first state is a low state, the second state may be a high state.

The voltage generator 605 may receive the power control signal BPC_CTR of the second state to stop the output of the initialization voltage Vint. In other words, the voltage generator 605 may not output the initialization voltage Vint in the low-frequency operation mode LFM.

Thus, power consumed in the voltage generator 605 during the low-frequency operation mode LFM may be reduced by the power control signal BPC_CTR.

As illustrated in FIG. 2, the fourth transistor T4 and the seventh transistor T7 may receive the same initialization voltage Vint. Alternatively, according to another exemplary embodiment of the inventive concept, the fourth transistor T4 and the seventh transistor T7 may receive different initialization voltages. In the low-frequency operation mode, the seventh transistor T7 may operate at the reference frequency and the fourth transistor T4 may operate at a frequency lower than the reference frequency. In this case, in the low-frequency operation mode, the voltage generator 605 of FIG. 14 may not stop the output of the initialization voltage provided to the seventh transistor T7 but may stop only the output of the initialization voltage provided to the fourth transistor T4.

Figure 15:
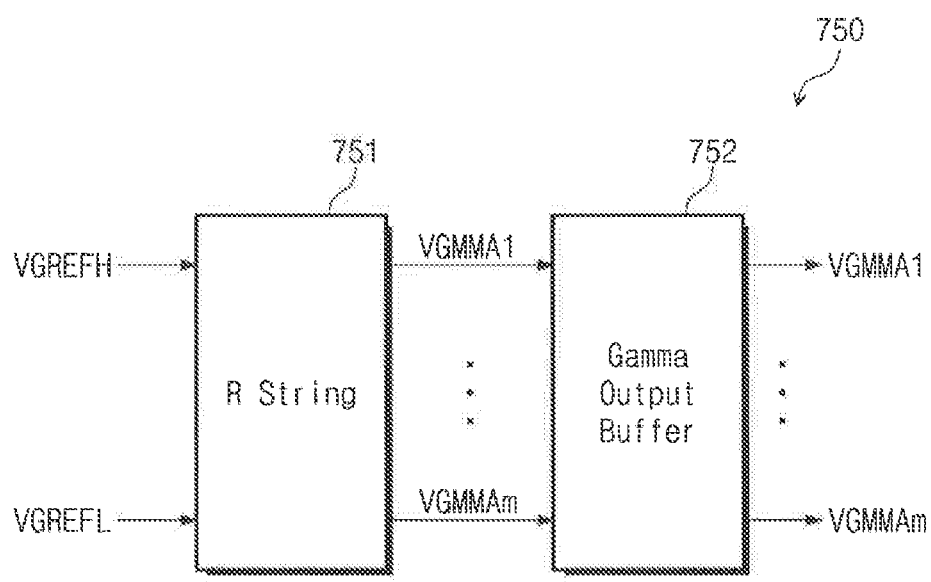
FIG. 15 is a block diagram illustrating a gamma voltage generator according to an exemplary embodiment of the inventive concept.
Figure 16:
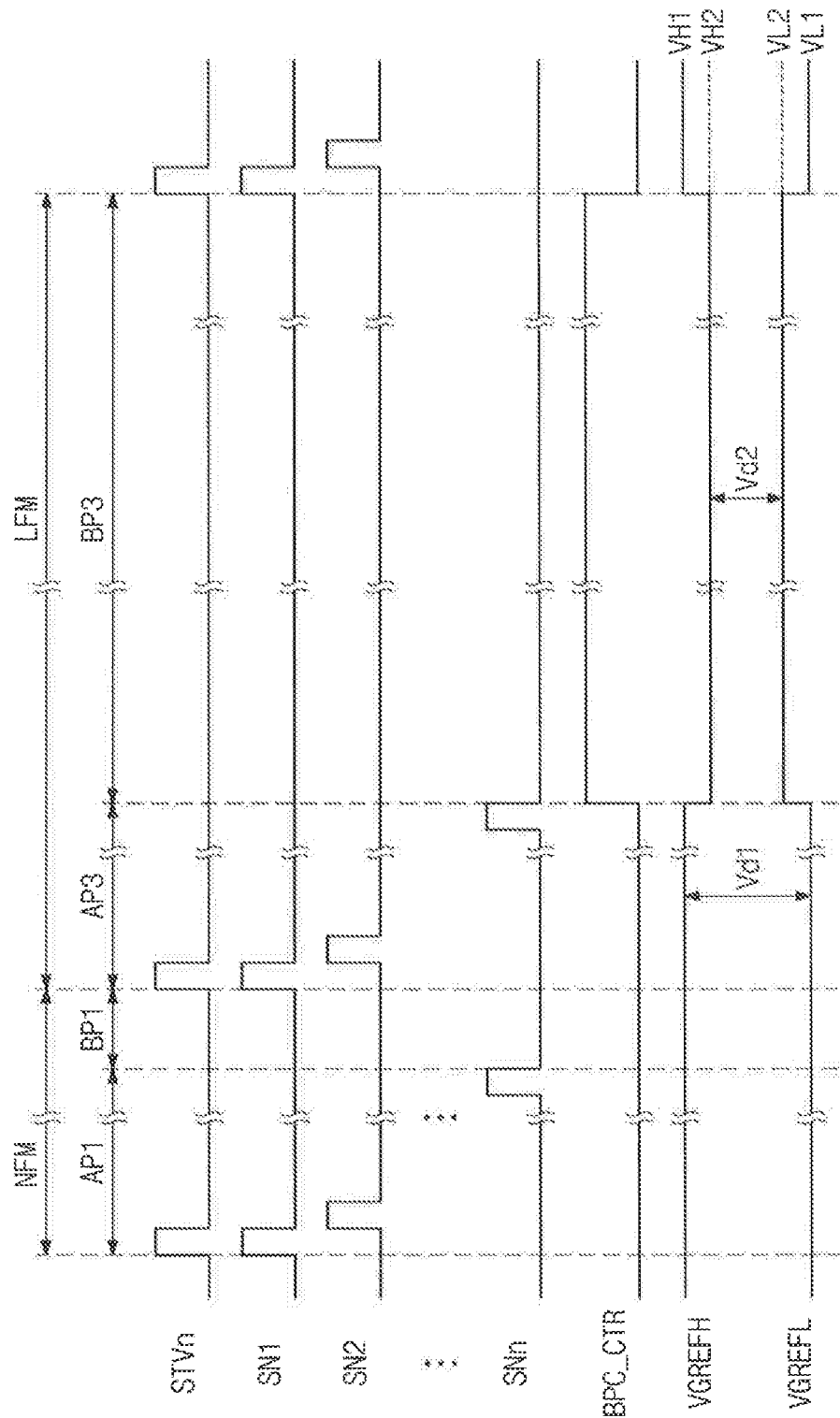
FIG. 16 is a waveform diagram illustrating changes in a power control signal and a gamma reference voltage according to an operation mode.

FIG. 15 is a block diagram illustrating a gamma voltage generator according to an exemplary embodiment of the inventive concept, and FIG. 16 is a waveform diagram illustrating changes in a power control signal and a gamma reference voltage according to an operation mode.

Referring to FIGS. 14 and 15, the gamma voltage generator 750 according to an exemplary embodiment of the inventive concept may include a resistance string (hereinafter, referred to as an R string) 751 and a gamma output buffer 752.

The R string 751 may receive the high gamma reference voltage VGREFH and the low gamma reference voltage VGREFL from the voltage generator 605. The R string 751 may include a plurality of resistances (e.g., resistors) connected in series to each other. The high gamma reference voltage VGREFH may be applied to a first terminal of the R string 751, and the low gamma reference voltage VGREFL may be applied to a second terminal of the R string 751. The R string 751 further comprises in output terminals for outputting m gamma voltages VGMMA1 to VGMMAm, the m output terminals may be provided between the first terminal and the second terminal of the R string 751.

The m output terminals may be connected to the gamma output buffer 752. The gamma output buffer 752 may include in op-amps connected to the in output terminals, respectively. The gamma output buffer 752 may provide the m gamma voltages VGMMA1 to VGMMAm to the data driver 400.

Referring to FIGS. 15 and 16, the power control signal BPC_CTR may have the first state in the normal operation mode NFM. When the voltage generator 605 receives the power control signal BPC_CTR of the first state, the high gamma reference voltage VGREFH and the low gamma reference voltage VGREFL may have magnitudes corresponding to those of a first high voltage VH1 and a first low voltage VL1, respectively. Here, the first high voltage VH1 and the first low voltage VL1 may have a first voltage difference Vd1 therebetween.

When the operation mode of the display device 1000 is changed to the low-frequency operation mode LFM, the power control signal BPC_CTR may have the second state during the third blank period BP3. For example, when the first state is a low state, the second state may be a high state.

The voltage generator 605 may receive the power control signal BPC_CTR of the second state to change the magnitudes of the high gamma reference voltage VGREFH and the low gamma reference voltage VGREFL. In other words, the voltage generator 605 may output the high gamma reference voltage VGREFH having a magnitude corresponding to that of a second high voltage VH2 and the low gamma reference voltage VGREFL having a magnitude corresponding to that of a second low voltage VL2. Here, the magnitude of the second high voltage VH2 may be less than that of the first high voltage VH1, and the magnitude of the second low voltage VL2 may be greater than that of the first low voltage VL1. Thus, a second voltage difference Vd2 between the second high voltage VH2 and the second low voltage VL2 may be less than the first voltage difference Vd1.

In another exemplary embodiment of the inventive concept, when the magnitude of the second high voltage VH2 is less than that of the first high voltage VH1, the magnitude of the second low voltage VL2 may be equal to that of the first low voltage VL1. In another exemplary embodiment of the inventive concept, when the magnitude of the second low voltage VL2 is greater than that of the first low voltage VL1, the magnitude of the second high voltage VH2 may be equal to that of the first high voltage VH1. In other words, one or both of the magnitudes of the high gamma reference voltage VGREFH and the low gamma reference voltage VGREFL may be changed to reduce the voltage difference Vd therebetween in the third blank period BP3.

In FIG. 16, all of the magnitudes of the high gamma reference voltage VGREFH and the low gamma reference voltage VGREFL are changed. However, the inventive concept is not limited thereto. In other words, according to other exemplary embodiments of the inventive concept, only one of the magnitudes of the high gamma reference voltage VGREFH and the low gamma reference voltage VGREFL may be changed to allow the high gamma reference voltage VGREFH and the low gamma reference voltage VGREFL to have a voltage difference less than the first voltage difference Vd1.

As a result, power consumed in the voltage generator 605 during the low-frequency operation mode LFM may be reduced by reducing the voltage difference between the high gamma reference voltage VGREFH and the low gamma reference voltage VGREFL.

FIGS. 15 and 16 illustrate the case in which the magnitudes of the high gamma reference voltage VGREFH and the low gamma reference voltage VGREFL are adjusted in the low-frequency operation mode LFM. However, the inventive concept is not limited thereto. In another exemplary embodiment of the inventive concept, the voltage generator 605 may stop the output of each of the high gamma reference voltage VGREFH and the low gamma reference voltage VGREFL in the low-frequency operation mode LFM.

Figure 17:
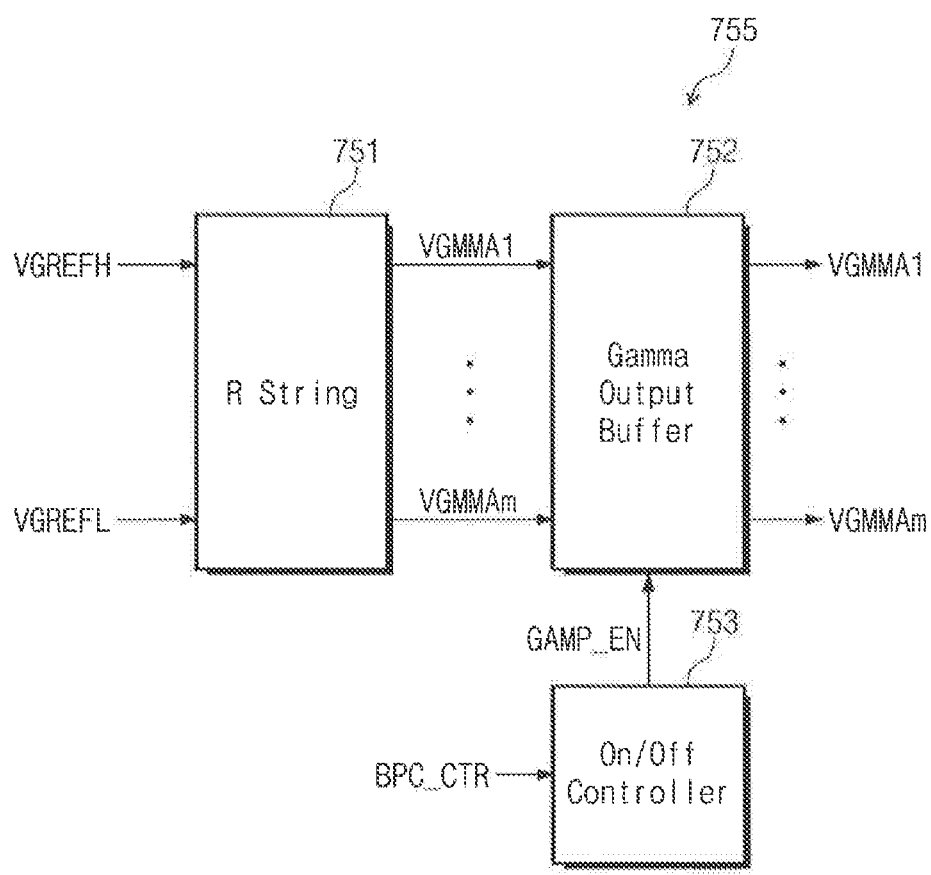
FIG. 17 is a block diagram illustrating a gamma voltage generator according to another exemplary embodiment of the inventive concept.
Figure 18:
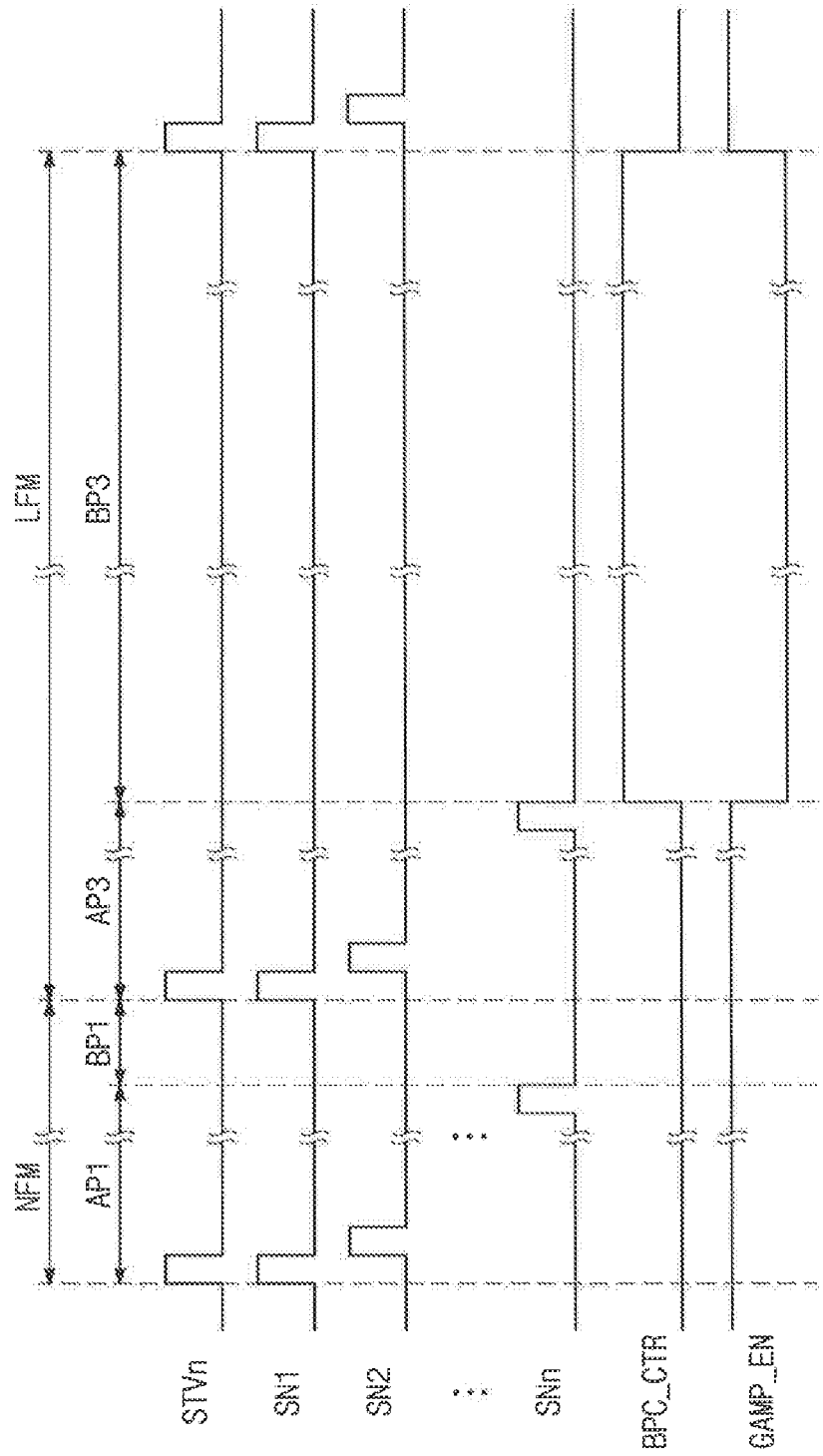
FIG. 18 is a waveform diagram illustrating a change in a power control signal according to an operation mode.

FIG. 17 is a block diagram illustrating a gamma voltage generator according to another exemplary embodiment of the inventive concept, and FIG. 18 is a waveform diagram illustrating a change in a power control signal according to an operation mode.

Referring to FIGS. 14 and 17, a gamma voltage generator 755 according to another exemplary embodiment of the inventive concept may include a resistance string (hereinafter, referred to as an R string) 751, a gamma output buffer 752, and an on/off controller 753. The on/off controller 753 may receive the power control signal BPC_CTR from the low-frequency driving controller 503. The on/off controller 753 may output an amp control signal GAMP_EN for controlling an on/off operation of the gamma output buffer 752, depending on the power control signal BPC_CTR. In other words, each of the op-amps of the gamma output buffer 752 may be turned on/off by the amp control signal GAMP_EN.

Referring to FIGS. 17 and 18, the power control signal BPC_CTR received from the low-frequency driving controller 503 may have a first state in the normal operation mode NFM. When the on/off controller 753 receives the power control signal BPC_CTR of the first state, the on/off controller 753 may output the amp control signal GAMP_EN of a second state, which is capable of turning-on the op-amps. Thus, the gamma voltages VGMMA1 to VGMMAm provided to the gamma output buffer 752 may be provided to the data driver 400 through the op-amps.

When the operation mode of the display device 1000 is changed to the low-frequency operation mode LFM, the power control signal BPC_CTR may have the second state during the third blank period BP3. For example, when the first state is a low state, the second state may be a high state.

The on/off controller 753 may receive the power control signal BPC_CTR of the second state to output the amp control signal GAMP_EN of the first state, which is capable of turning-off the op-amps. When the op-amps are turned-off by the amp control signal GAMP_EN the gamma voltages VGMMA1 to VGMMAm provided to the gamma output buffer 752 are not outputted through the op-amps.

Thus, the gamma output buffer 752 may operate at a frequency lower than the reference frequency in the low-frequency operation mode LFM by the amp control signal GAMP_EN. As a result, power consumed in the gamma voltage generator 755 may be reduced.

Figure 19:
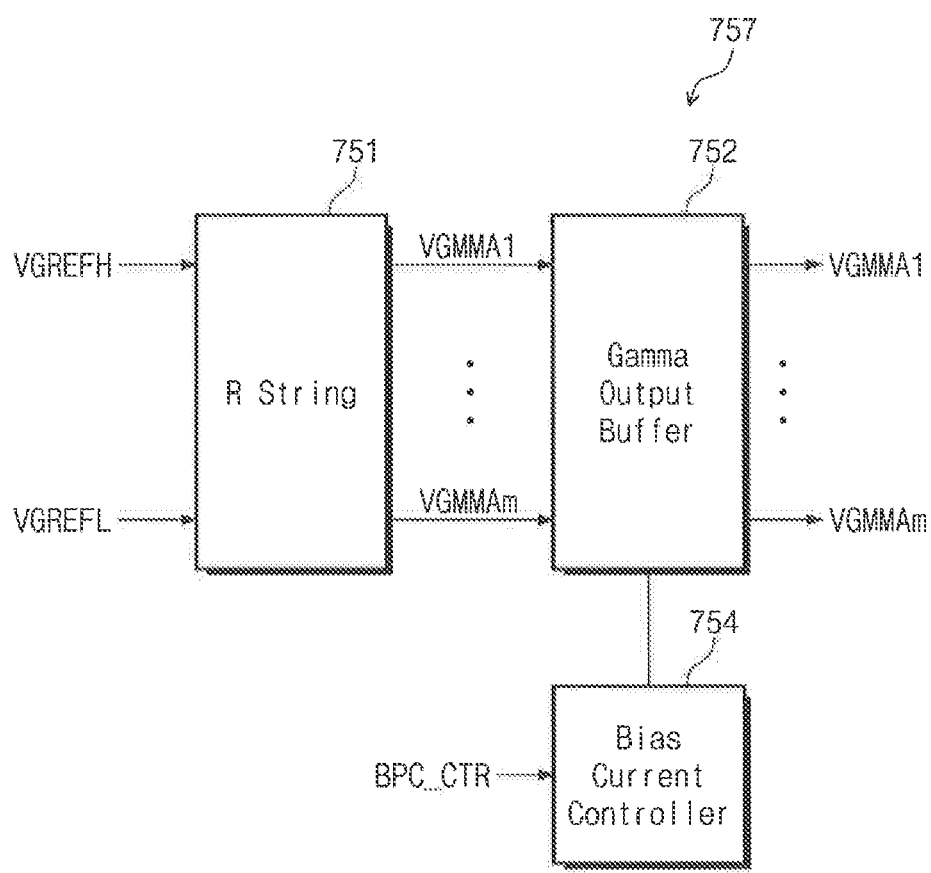
FIG. 19 is a block diagram illustrating a gamma voltage generator according to another exemplary embodiment of the inventive concept.
Figure 20:
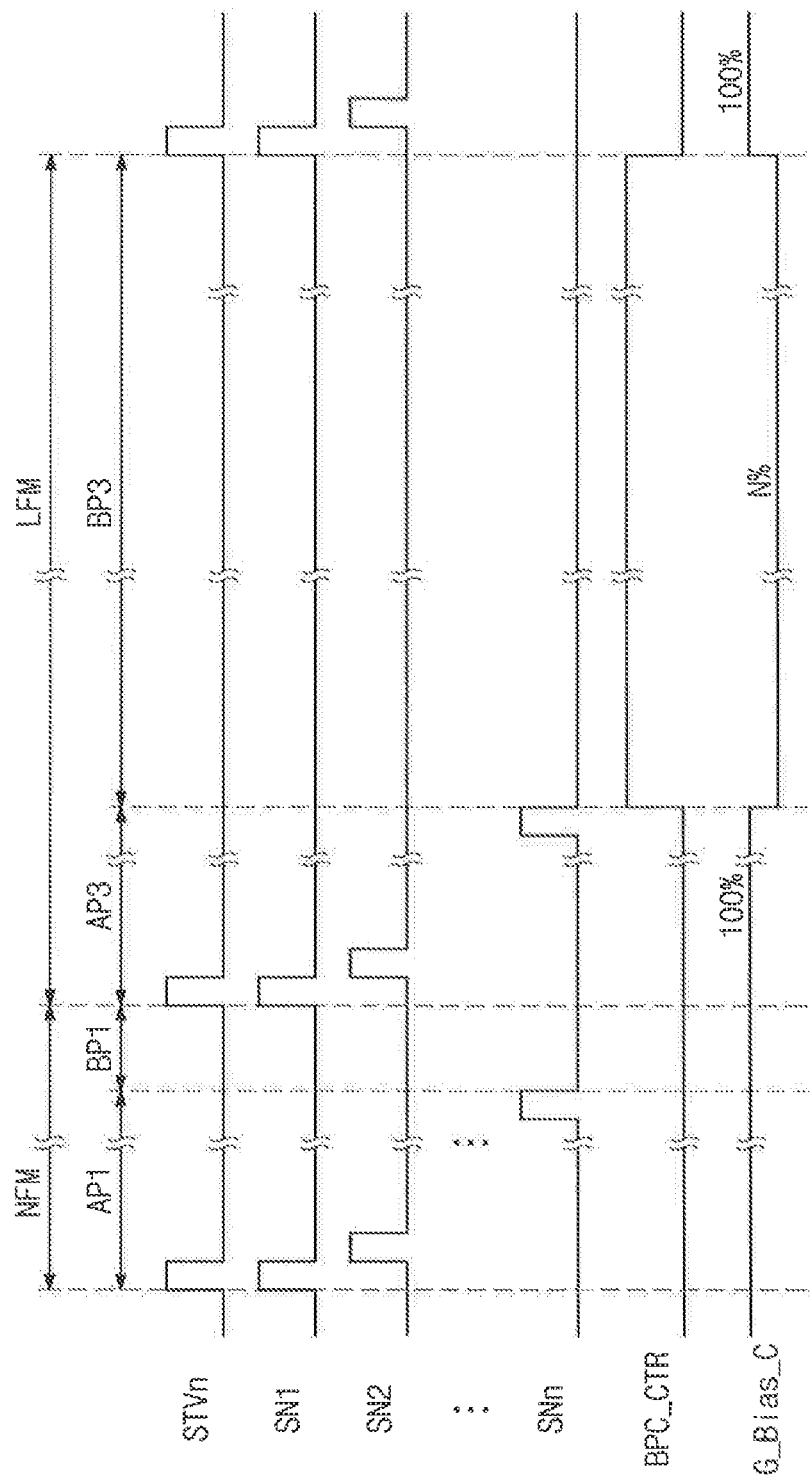
FIG. 20 is a waveform diagram illustrating a bias current according to an operation mode.

FIG. 19 is a block diagram illustrating a gamma voltage generator according to another exemplary embodiment of the inventive concept, and FIG. 20 is a waveform diagram illustrating a bias current according to an operation mode.

Referring to FIGS. 14 and 19, a gamma voltage generator 757 according to another exemplary embodiment of the inventive concept may include a resistance string (hereinafter, referred to as an R string) 751, a gamma output buffer 752, and a bias current controller 754.

For example, the gamma voltage generator 757 may include the bias current controller 754 for controlling a bias current of the gamma output buffer 752. The bias current controller 754 may receive the power control signal BPC_CTR from the low-frequency driving controller 503 and may control the bias current of the gamma output buffer 752 on the basis of the power control signal BPC_CTR.

A structure of the bias current controller 754 may be similar to the structure of the bias current controller 480 illustrated in FIG. 11. Thus, detailed descriptions to components of the bias current controller 754 will be omitted.

Referring to FIGS. 19 and 20, in the normal operation mode NFM, the bias current controller 754 may be controlled to allow a bias current G_Bias_C to have a preset magnitude. For example, the magnitude of the bias current G_Bias_C may be 100% of the preset magnitude during the normal operation mode NFM.

When the operation mode of the display device 1000 is changed to the low-frequency operation mode LFM, the bias current G_Bias_C may be changed to have N % of the preset magnitude during the third blank period BP3. Here, 'N' may be a number less than 100.

As a result, power consumed in the gamma voltage generator 757 in the low-frequency operation mode LFM may be reduced by adjusting the bias current G_Bias_C of the gamma output buffer 752.

According to exemplary embodiments of the inventive concept, the display device may include at least one transistor including an oxide semiconductor layer in a circuit part of a pixel. One or some of the scan driver, the data driver, the voltage generator and the gamma voltage generator may be driven in the low-frequency operation mode in the display device (e.g., an organic light emitting display device), and thus, the total power consumption of the display device may be reduced.

While the inventive concept has been described with reference to exemplary embodiments thereof, it will be apparent to those skilled in the art that various changes and modifications may be made thereto without departing from the spirit and scope of the inventive concept as set forth in the following claims.

What is claimed is:
1. A display device, comprising:
a display panel comprising a pixel connected to a first scan line, a second scan line, and a data line, the pixel comprising: a first switching element connected to the first scan line; a second switching element connected to the second scan line; and a light emitting element;
a low frequency driving controller configured to output a power control signal having a first level in a first operation mode and having a second level in a second operation mode, wherein in the second operation mode an image is displayed at a frequency lower than a reference frequency;
a first and scan driver configured to provide a first scan signal to the first scan line, wherein the first scan driver is configured to operate at the reference frequency in the second operation mode;
a second scan driver configured to provide a second scan signal to the second scan line, wherein the second scan driver is configured to operate at the frequency lower than the reference frequency in the second operation mode; and
a data driver configured to output a data signal to the data line and configured to operate in the second operation mode in response to the power control signal having the second level, wherein the data driver operates at the frequency lower than the reference frequency in the second operation mode.

2. The display device of claim 1, wherein the first switching element is a transistor including a low-temperature polycrystalline silicon semiconductor layer, and wherein the second switching element is a transistor including an oxide semiconductor layer.

3. The display device of claim 2, wherein the first and second scan drivers operate at the reference frequency in the first operation mode.

4. The display device of claim 1, wherein the data driver comprises: an output buffer for outputting the data signal, and wherein the output buffer operates in the second operation mode in response to the power control signal having the second level.

5. The display device of claim 4, wherein the data driver further comprises: an on/off controller for turning-on the output buffer in the first operation mode and for turning-off the output buffer in the second operation mode.

6. The display device of claim 5, wherein the data driver further comprises: a switching circuit configured to provide a reference voltage to an output terminal of the output buffer in response to the power control signal having the second level.

7. The display device of claim 6, wherein the switching circuit is turned-off in the first operation mode and is turned-on in the second operation mode to apply the reference voltage to the output terminal of the output buffer.

8. The display device of claim 7, further comprising: a voltage generator configured to supply the reference voltage to the switching circuit.

9. The display device of claim 4, wherein the data driver further comprises: a bias current controller configured to control a bias current of the output buffer.

10. The display device of claim 9, wherein the bias current controller adjusts the bias current of the output buffer to a preset magnitude in the first operation mode, and wherein the bias current controller adjusts the bias current of the output buffer to a magnitude less than the preset magnitude in the second operation mode.

11. The display device of claim 1, wherein the pixel comprises:
a first transistor comprising: a first electrode connected to a first driving voltage; a second electrode electrically connected to an anode of the light emitting element; and a gate electrode;
a second transistor comprising: a first electrode connected to the data line; a second electrode connected to the first electrode of the first transistor; and a gate electrode connected to the first scan line to receive the first scan signal; and
a third transistor comprising: a first electrode connected to the gate electrode of the first transistor; a second electrode connected to the second electrode of the first transistor; and a gate electrode connected to the second scan line to receive the second scan signal.

12. The display device of claim 11, wherein the second transistor is included in the first switching element and the first transistor is the same type as the second transistor, and wherein the third transistor is included in the second switching element.

13. The display device of claim 12, wherein the first and second transistors operate at the reference frequency in the second operation mode, and the third transistor operates at the frequency lower than the reference frequency in the second operation mode.

14. The display device of claim 11, wherein the pixel further comprises:
a fourth transistor comprising: a first electrode connected to the gate electrode of the first transistor; a second electrode connected to an initialization voltage line; and a gate electrode configured to receive a third scan signal;
a fifth transistor comprising: a first electrode connected to the first driving voltage; a second electrode connected to the first electrode of the first transistor; and a gate electrode configured to receive an emission control signal;
a sixth transistor comprising: a first electrode connected to the second electrode of the first transistor; a second electrode connected to the anode of the light emitting element; and a gate electrode configured to receive the emission control signal; and
a seventh transistor comprising: a first electrode connected to the second electrode of the fourth transistor, a second electrode connected to the anode of the light emitting element; and a gate electrode configured to receive a fourth scan signal.

15. The display device of claim 14, wherein the second transistor is included in the first switching element, and the first, fifth, sixth and seventh transistors are the same type as the second transistor, wherein the third transistor is included in the second switching element, and the fourth transistor is the same type as the third transistor.

16. The display device of claim 15, wherein each of the first, second, fifth, sixth and seventh transistors is a transistor including a low-temperature polycrystalline silicon semiconductor layer, and wherein each of the third and fourth transistors is a transistor including an oxide semiconductor layer.

17. The display device of claim 16, wherein the first, second, fifth, sixth and seventh transistors operate at the reference frequency in the second operation mode, and the third and fourth transistors operate at the frequency lower than the reference frequency in the second operation mode.

18. A display device, comprising:
a display panel comprising a pixel connected to a first scan line, a second scan line, and a data line, the pixel comprising: a first type switching element connected to the first scan line; a second type switching element connected to the second scan line; and a light emitting element;
a low-frequency driving controller configured to output a power control signal having a first level in a first operation mode and having a second level in a second operation mode, wherein in the second operation mode an image is displayed at a frequency lower than a reference frequency;
a first scan driver configured to output a first scan signal to the first scan lines, wherein the first scan driver is configured to operate at the reference frequency in the second operation mode;
a second scan driver configured to output a second scan signal to the second scan line, wherein the second scan driver is configured to operate at the frequency lower than the reference frequency in the second operation mode;
a data driver configured to provide a data signal to the data line; and
a voltage generator configured to control an output or a magnitude of at least one voltage, provided to the display panel, the first and second scan drivers and the data driver, in response to the power control signal.

19. The display device of claim 18, wherein the display panel further comprises an initialization voltage line configured to receive an initialization voltage, and wherein the voltage generator is configured to generate the initialization voltage and to supply the initialization voltage to the display panel.

20. The display device of claim 19, wherein the voltage generator supplies the initialization voltage to the display panel in the first operation mode and stops the supply of the initialization voltage to the display panel in response to the power control signal in the second operation mode.

21. The display device of claim 19, wherein the pixel comprises:
- a first transistor comprising: a first electrode connected to a first driving voltage; a second electrode electrically connected to an anode of the light emitting element; and a gate electrode;
- a second transistor comprising: a first electrode connected to the data line; a second electrode connected to the first electrode of the first transistor; and a gate electrode connected to the first scan line;
- a third transistor comprising: a first electrode connected to the second electrode of the first transistor; a second electrode connected to the gate electrode of the first transistor; and a gate electrode connected to the second scan line; and
- a fourth transistor comprising: a first electrode connected to the gate electrode of the first transistor; a second electrode connected to the initialization voltage line; and a gate electrode connected to a third scan line.

22. The display device of claim 21, wherein each of the first and second transistors includes a low-temperature polycrystalline silicon semiconductor layer, and wherein each of the third and fourth transistors includes an oxide semiconductor layer.

23. The display device of claim 22, wherein the second transistor is included in the first switching element and the third transistor is included in the second switching element, wherein the first transistor is the same type as the second transistor and the fourth transistor is the same type as the third transistor.

24. The display device of claim 22, wherein the first and second transistors operate at the reference frequency in the second operation mode, and the third and fourth transistors operate at the frequency lower than the reference frequency in the second operation mode.

25. The display device of claim 18, further comprising:
- a gamma voltage generator configured to generate a plurality of gamma voltages according to a gamma reference voltage and to provide the generated gamma voltages to the data driver,
- wherein the voltage generator is configured to generate the gamma reference voltage and to provide the gamma reference voltage to the gamma voltage generator.

26. The display device of claim 25, wherein the gamma reference voltage includes a high gamma reference voltage and a low gamma reference voltage,
- wherein the voltage generator outputs a first high voltage and a first low voltage as the high gamma reference voltage and the low gamma reference voltage, respectively, in the first operation mode, and
- wherein the voltage generator outputs a second high voltage and a second low voltage as the high gamma reference voltage and the low gamma reference voltage, respectively, in the second operation mode.

27. The display device of claim 26, wherein when the second high voltage has a lower level than the first high voltage, the second low voltage has the same level as or a higher level than the first low voltage, and
- wherein when the second low voltage has a higher level than the first low voltage, the second high voltage has the same level as or a lower level than the first high voltage.

28. The display device of claim 25, wherein the gamma voltage generator comprises: a gamma output buffer for outputting the gamma voltages.

29. The display device of claim 28, wherein the gamma voltage generator further comprises: an on/off controller for turning-on the gamma output buffer in the first operation mode and for turning-off the gamma output buffer in the second operation mode.

30. The display device of claim 28, wherein the gamma voltage generator further comprises: a bias current controller configured to control a bias current of the gamma output buffer,
- wherein the bias current controller adjusts the bias current of the gamma output buffer to a preset magnitude in the first operation mode, and
- wherein the bias current controller adjusts the bias current of the gamma output buffer to a magnitude less than the preset magnitude in the second operation mode.

* * * * *